United States Patent
Scherer et al.

(10) Patent No.: US 6,466,709 B1
(45) Date of Patent: Oct. 15, 2002

(54) PHOTONIC CRYSTAL MICROCAVITIES FOR STRONG COUPLING BETWEEN AN ATOM AND THE CAVITY FIELD AND METHOD OF FABRICATING THE SAME

(75) Inventors: Axel Scherer, Laguna Beach, CA (US); Jelena Vuckovic, Pasadena, CA (US); Marko Longcar, Pasadena, CA (US); Hideo Mabuchi, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/847,743

(22) Filed: May 2, 2001

(51) Int. Cl.[7] ............................. G02B 6/26; H01L 21/00; H01S 3/098
(52) U.S. Cl. ..................... 385/15; 385/14; 385/129; 385/130; 385/131; 385/122; 385/28; 438/22; 438/29; 438/31; 372/19; 372/21; 372/98
(58) Field of Search ............................. 385/14, 15, 129, 385/130, 131, 122, 141, 27, 28, 37; 372/19, 20, 21, 22, 96, 102, 98; 438/22, 29, 31, 32

(56) References Cited

U.S. PATENT DOCUMENTS

| | | | |
|---|---|---|---|
| 5,440,421 A | * 8/1995 | Fan et al. | 216/24 |
| 5,600,483 A | * 2/1997 | Fan et al. | 257/17 |
| 5,682,401 A | * 10/1997 | Joannopoulos et al. | 372/92 |
| 5,784,400 A | * 7/1998 | Joannopoulos et al. | 372/50 |
| 5,990,850 A | * 11/1999 | Brown et al. | 343/909 |
| 6,040,936 A | * 3/2000 | Kim et al. | 359/245 |
| 6,052,213 A | * 4/2000 | Burt et al. | 359/237 |
| 6,058,127 A | * 5/2000 | Joannopoulos et al. | 372/102 |
| 6,134,369 A | * 10/2000 | Kurosawa | 385/129 |
| 6,278,105 B1 | * 8/2001 | Mattia | 250/214.1 |

* cited by examiner

Primary Examiner—Brian Healy
(74) Attorney, Agent, or Firm—Daniel L. Dawes; Myers, Dawes & Andras LLP

(57) ABSTRACT

Optical microcavities based on two dimensional arrays of holes defined in photonic crystals are optimized for maximum Q factors and minimum mode volume. They can also be used for strong coupling between the cavity field and an atom trapped within a defect of the photonic crystals, or for tunable filters if the holes are filled with electro-optical polymers. In one embodiment the Q factor of a cavity is increased by elongation of a plurality of holes in at least one row in a predetermined direction. Modal structures of microcavities, as well as quality factors, mode volumes, symmetry properties and radiation patterns of localized defect modes as a function of the slab thickness and parameters of photonic crystal and defects are illustrated.

31 Claims, 19 Drawing Sheets

PHOTONIC CRYSTAL MICROCAVITIES FOR STRONG COUPLING BETWEEN AN ATOM AND THE CAVITY FIELD AND METHOD OF FABRICATING THE SAME

The U.S. Government has certain rights in this invention pursuant to Grant No. DAA H04-96-1-0389 awarded by the U.S. Army.

BACKGROUND OF THE INVENTION

1. Field of the Invention

The invention relates to optical microcavities based on two dimensional photonic crystals, which are optimized for maximum Q factor and minimum load volume. These cavities can also be used for strong coupling between the cavity field and an atom trapped within a hole of the photonic crystals.

2. Description of the Prior Art

Various passive and active optical devices can be constructed by introducing point or line defects into a periodic array of holes perforating an optically thin semiconductor slab. Point or line defects into a periodic array of holes has previously been used in making a semiconductor (InGaAsP) laser emitting at $\lambda=1.55$ $\mu$m, and for demonstrating silicon optical waveguides with sharp bends. In these structures, light is confined laterally by means of distributed Bragg reflection and vertically by total internal reflection. The advantage of this approach lies in facilitating the integration of many optical components on a single chip.

Microcavity formation via alteration of the refractive index of a single defect hole in a hexagonal photonic crystal has been previously analyzed theoretically. In that analysis, the radius of the defect was equal to that of the unperturbed holes in the photonic crystals, but its refractive index was tuned between one and the refractive index of the slab. It was predicted that, in the described structure, dipole defect modes can be excited with quality factors as high as 30000. However, that analysis was in fact incorrect for reasons described below. Q factors of the structures analyzed in the prior art were in fact of the order of 2000 at a maximum.

BRIEF SUMMARY OF THE INVENTION

The invention is an optical apparatus or optical microcavity comprising an array of holes or regions of optical discontinuity in a photonic crystal, and a defect in the array of holes created by elongation of the holes in the array in a predetermined direction thereby defining in the array of holes in the photonic crystal an asymmetrical optical cavity with a Q factor in excess of 2000 and typically in excess of 30,000. The holes are generally air filled, but they may also be filled with material which is distinct from the material of the photonic crystal, namely an optically nonlinear organic material.

In the illustrated embodiment the array of holes in the photonic crystal is an hexagonal array, but any geometric array may be equally substituted. The optical cavity which created by the invention may be used in a laser, a waveguide or a filter among other any other photonic device now known or later devised.

In the illustrated embodiment the asymmetrical optical cavity which is created by elongation of a single row of holes in the array in a predetermined direction. This elongation allows tuning of frequency and Q factor of a cavity. The optical cavity is arranged and configured to support modes having maximum electric (E) field intensity in the air region. This is useful for cavity QED experiments, or tunable filters having photonic crystal holes filled with electro-optic polymers. For the purpose of cavity QED experiments the optical cavity is characterized by a critical atom number, $N_0$, and a photon number, $m_0$, less than 1.

Again in one embodiment the array of holes has a central hole with a radius reduced relative to other ones of the holes in the array, and a row of holes including the central hole have their radii elongated in a defined direction. The neighboring ones of the holes are characterized by a distance between their respective centers and the array of holes has a central hole with a radius reduced to $r_2$ relative to other ones of the holes in the array. Selected neighboring holes to the central hole have their radii reduced to $r_1$ relative to other ones of the holes in the regular array and moved by $r-r_1$ away from the central hole in a direction defined by a line connecting centers of the central hole and the neighboring holes to preserve the distance between the neighboring holes and holes neighboring them in turn along a defined direction. A row of holes including the central hole have their radii elongated in the defined direction. The reduction of radius $r_2$ and $r_1$ movement by $r-r_1$ and elongation in the defined direction are chosen so that the microcavity created thereby is tuned.

From yet another viewpoint the defect is arranged and configured in the array to maximize microcavity mode quality factor Q and to minimize mode volume. $V_{mode}$.

In another view the defect is arranged and configured in the array to strongly couple cavity field with a single gas phase atom.

The spaces within the holes are termed as hole regions. The defect is arranged and configured in the array to provide a maximum of E-field intensity in a hole region. The hole region may be an air filled or filled with a material different from the material of the photonic crystal.

In other embodiments the defect is arranged and configured in the array to provide a maximum of E-field intensity in a region within the photonic crystal.

The invention is also defined as a method of fabricating an apparatus with the above characterizing features using an analogous combination of steps.

While the method has been described for the sake of grammatical fluidity as steps, it is to be expressly understood that the claims are not to be construed as limited in any way by the construction of "means" or "steps" limitations under 35 USC 112, but to be accorded the full scope of the meaning and equivalents of the definition provided by the claims. The invention can be better visualized by turning now to the following drawings wherein like elements are referenced by like numerals.

BRIEF DESCRIPTION OF THE DRAWINGS

FIG. 6 is a graph of the position of the air and dielectric band gap edges for TE-like modes of a thin slab (n=3.5) surrounded by air on both sides and patterned with a hexagonal array of air holes. The band gap is calculated as a function of photonic crystal parameters, r/a and d/a.

FIG. 11b is the top plan view as seen of a slice through the middle of the membrane, in the x-y plane and FIG. 11a is a side elevational view of the x-z half-plane (z>0).

FIG. 19a shows constructive coupled defect states and FIG. 19b shows destructive coupled defect states.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Figure 1:
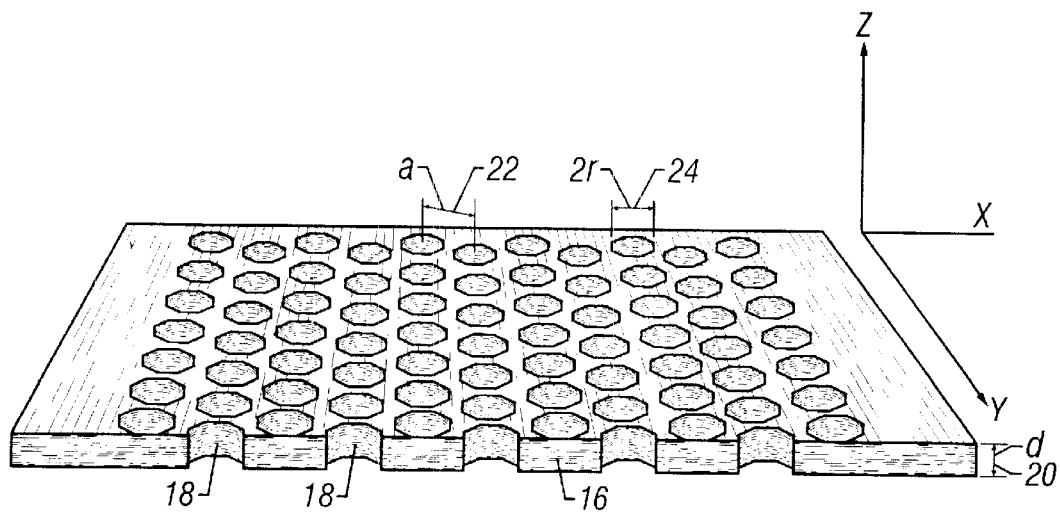
FIG. 1 is a perspective view in enlarged scale of a photonic crystal in which an hexagonal array of air holes has been defined as known in the prior art.
Figure 2:
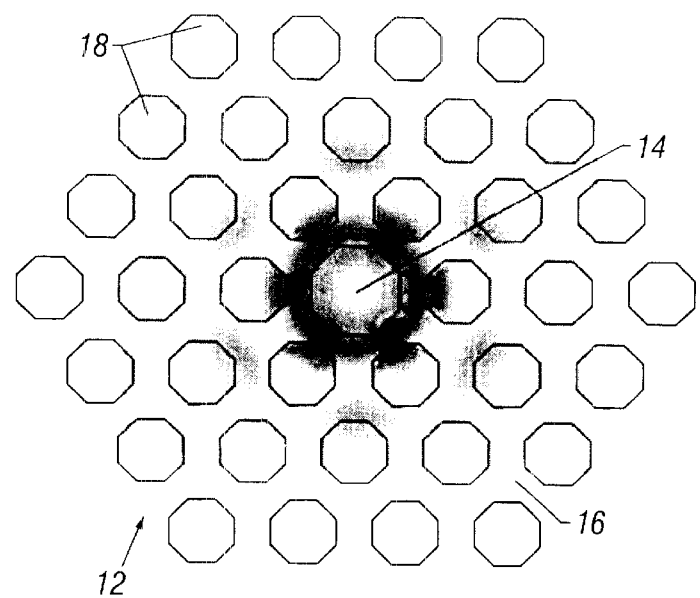
FIG. 2 is a two dimensional diagram of the electric field intensity pattern of an acceptor defect state excited in the hexagonal photonic crystal of air holes perforating an optically thin slab as shown in FIG. 1. The defect is formed by increasing the radius of the central hole. The plotted intensity pattern is for the x-y plane at the middle of the slab.

As diagrammatically depicted in FIG. 1 the prior art provided for the formation of a microcavity 12 as shown for example in field map of FIG. 2 by means of alteration of the refractive index by a single defect hole 14 in a hexagonal photonic crystal 10. An analysis of this problem is presented below and the influence of unintentional deformations of the structure introduced by the use of mirror boundary conditions is addressed. Quality factors of the prior art single defect structures are limited to several thousand. However, Q factors of more than 30000 can be achieved in microcavities 12 of the present invention.

Microcavities can be formed by either changing the refractive index of a single hole 14, or by reducing its radius.

According to the invention the designs of microcavities 12 are optimized for strong coupling between the cavity field and an atom trapped within a hole 14 of the photonic crystal 10. However, these designs can also be used for cavities for filters. Using a three dimensional, finite difference time-domain (FDTD) method, Q factors of over 30000 can be predicted in these structures. Radiation patterns of dipole defect modes are discussed and finally a methodology for fabricating these microcavities 12 is disclosed.

The microcavities 12 are formed by introducing point defects into a dielectric slab 16 patterned with a hexagonal array of air holes 18. In the illustrated prior art embodiment the thickness 20 of the slab 16 is d and its refractive index is equal to 3.4. The inter-hole spacing 22 is denoted by a, the hole radius 24 by r, as shown in FIG. 1 and $\lambda$ is the wavelength in air of the light. In all the calculations here, the boundary for separation of vertical from lateral loss (i.e. the vertical quality factor $Q_{195}$ from the lateral quality factor $Q_{II}$) was positioned approximately at $\lambda/2$ from the surface of the membrane (not shown) which includes slab 16. As the number of photonic crystals layers around the defect 14 increases, $Q_{II}$ increases exponentially and the total quality factor Q approaches $Q_\perp$. Also assume that x=0, y=0, z=0 denotes the center of the cavity and z=0 is the middle plane of the slab.

Single Defect Hole

Figure 3A:
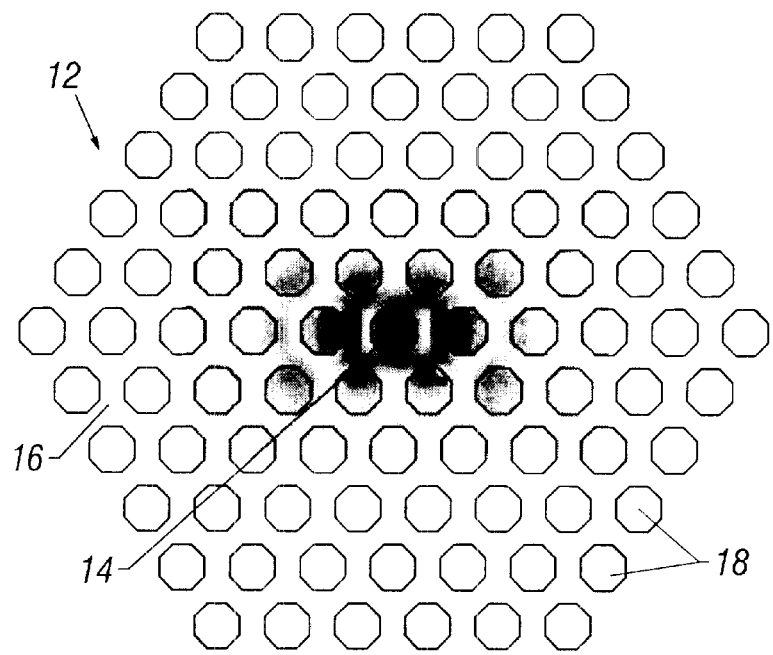
FIGS. 3a and 3b are two dimensional diagrams of the electric field intensity patterns of the y-dipole and x-dipole mode respectively. Parameters of the structure are r/a=0.3, d/a=0.6 and in the used discretization a=15. The refractive index of the slab is 3.4 and of the defect is 2.4. The plotted intensity patterns are for the x-y plane at the middle of the slab.
Figure 3B:
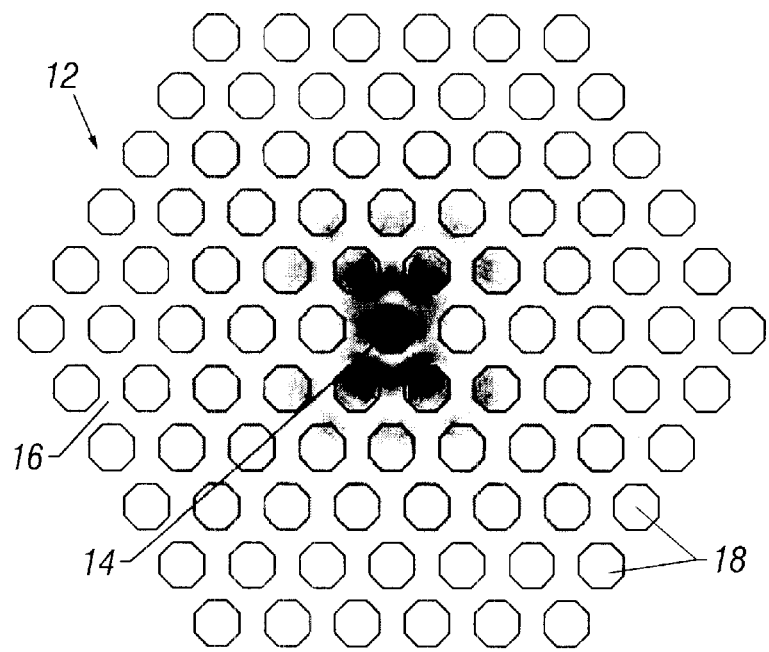

The simplest prior art method of forming a microcavity 12 starting from the structure or photonic crystal 10 shown in FIG. 1 is by changing the radius of a single hole 18, or by changing its refractive index. This method is more interesting from the point of fabrication than tuning the refractive index of a single hole, since the lithographic tuning of parameters of individual holes 18 is a simple process. By increasing the radius of a single hole 18, an acceptor defect state is excited, i.e. pulled into the band-gap from the dielectric band. On the other hand, by decreasing the radius of an individual hole 18 or by tuning its refractive index between 1 and the refractive index of the slab 16, a donor defect state is excited and pulled into the band gap from the air band. Acceptors tend to concentrate their electric field energy density in regions where the large refractive index was located in the unperturbed photonic crystal 10, as shown in FIG. 2, while the electric field energy density of donors is concentrated in regions where there was air in the prior art unperturbed photonic crystal 10, as shown in FIGS. 3a and 3b for the y- and x-dipole modes respectively. Due to an increase in vertical scattering at the edges of large defect holes 14, quality factors obtainable by acceptors are smaller than those of donors. Furthermore, since the electric field energy in air regions is small, these modes are not good candidates for strong coupling with a single gas-phase atom, which would be trapped in the air region. Therefore, in the illustrated embodiment only donor states will be discussed.

A. Changing the Refractive Index of a Single Hole

Figure 4:
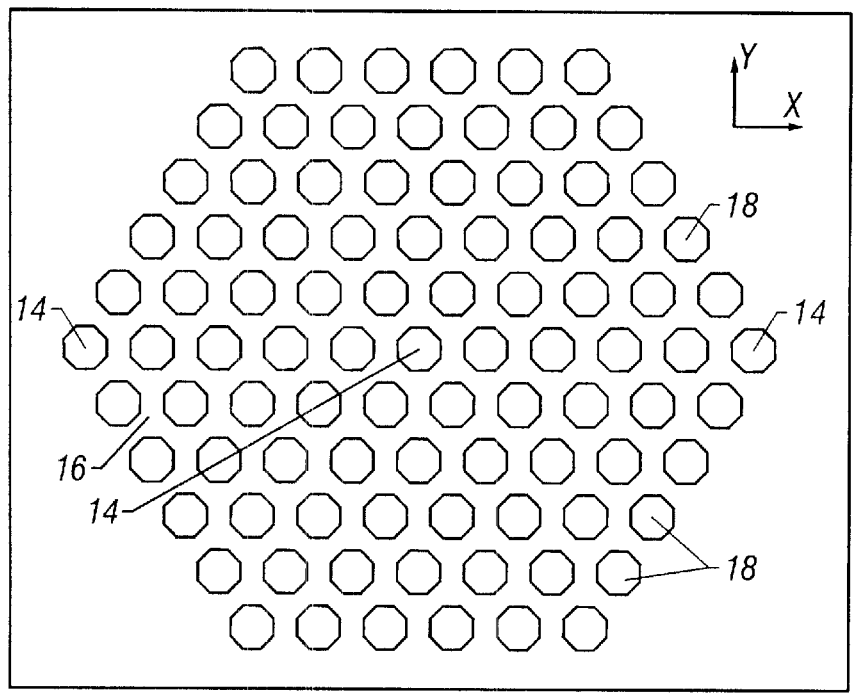
FIG. 4 is a two dimensional diagram of the electric field intensity pattern of an acceptor defect state which has been deformed by the application of mirror boundary conditions along the x and y axes and through the center of the defect. The applied mirror boundary conditions select the x-dipole mode, whose electric field pattern is shown in FIG. 3a. Holes on the x axis (in the central row, containing the defect) are elongated by 1 point in the y direction. The refractive index of the defect is $n_{defect}$=2.4. Parameters of the structure are r/a=0.3, d/a=0.6 and in the applied discretization a=15.

Microcavities 12 formed by the prior art method of altering the refractive index of a single hole 18 in a hexagonal photonic crystal were previously theoretically analyzed. It was incorrectly predicted that dipole-like donor states shown in FIGS. 3a and 3b with Q's of up to 30000 could be excited in these structures. However, quality factors of these microcavities 12 are in truth limited to several thousand. Previously, the mirror boundary conditions were applied in x, y and z directions to reduce the computation size eight times. Even the way mirror boundary conditions are implemented in the FDTD code introduces small deformations of the analyzed structure. For example, the combination of mirror boundary conditions used to select the x-dipole mode leads to the deformation of the structure as shown in FIG. 4. Holes 18 on the x-axis are elongated in the y direction by one data pixel or point in the FDTD coding in such a way that the distance between holes in x and y directions is preserved. This means that if we elongate holes in the central row by p/2 points both in the +y and −y direction (i.e. elongate by p points total), then the half-space y>p/2 (and also y<−p/2) is the unperturbed photonic crystal 10. The symmetry of the photonic crystal 10 surrounding the defect 14 is, therefore, broken, and this in turn leads to higher values of Q factors for x-dipole modes. Furthermore, in our earlier analysis even mirror boundary conditions were also applied in the z direction causing a slight increase of the thickness of the slab 16. The correct d/a ratios of the structures previously analyzed at Painter et. al., "Defect Modes of a two-dimensional Photonic Crystal in an Optically Thin Dielectric Slab," J. Op. Soc. America B, vol. 16, no. 2, pp 275–285 (1999) should would be 0.6, 0.46 and 1, instead the values of 0.53, 0.4 and 0.93, as noted there.

A.1 Perfectly Symmetric Cavity

Consider a structure with r/a=0.3, d/a=0.6, $n_{defect}$=2.4, $n_{slab}$=3.4, five layers of holes 18 around the defect and a=15 in the used discretization. For this set of parameters, the predicted $Q_\perp$ for the x-dipole mode was 30000. In the present analysis, even mirror boundary conditions were applied to the lower boundary in the z direction only, to reduce the computation size by one half and eliminate TM-like modes. Absorbing boundary conditions were applied to all boundaries in x and y directions and to the upper boundary in z direction. The initial field distribution was chosen in such a way to excite the x or y dipole mode separately. For the x-dipole mode, we calculate $Q_{II}$=2260, $Q_\perp$=1730 and a/$\lambda$=0.3137, and for the y-dipole mode we calculate QII=1867, $Q_\perp$=1007 and a/$\lambda$=0.3182. The difference in parameters of x and y dipole modes comes partly from the asymmetry of the structure introduced by imperfect discretization. In the two dimensional photonic crystal, i.e. for the infinite slab thickness, these two modes would be degenerate. However, in the thin slab, the y-dipole mode suffers more vertical scattering at the edges of holes and, therefore, has a lower $Q_{195}$.

For the applied initial field distribution that was not symmetric, leading to excitation of both x and y dipole modes, we calculated $Q_{II}$=2070, $Q_\perp$=1290 and a/$\lambda$=0.316. This mode can be represented as a superposition of the x and y dipole, with weighting factors depending on the initial field. Its Q and frequency depend on these weighting factors.

A.2 Asymmetric Cavity

Figure 5A:
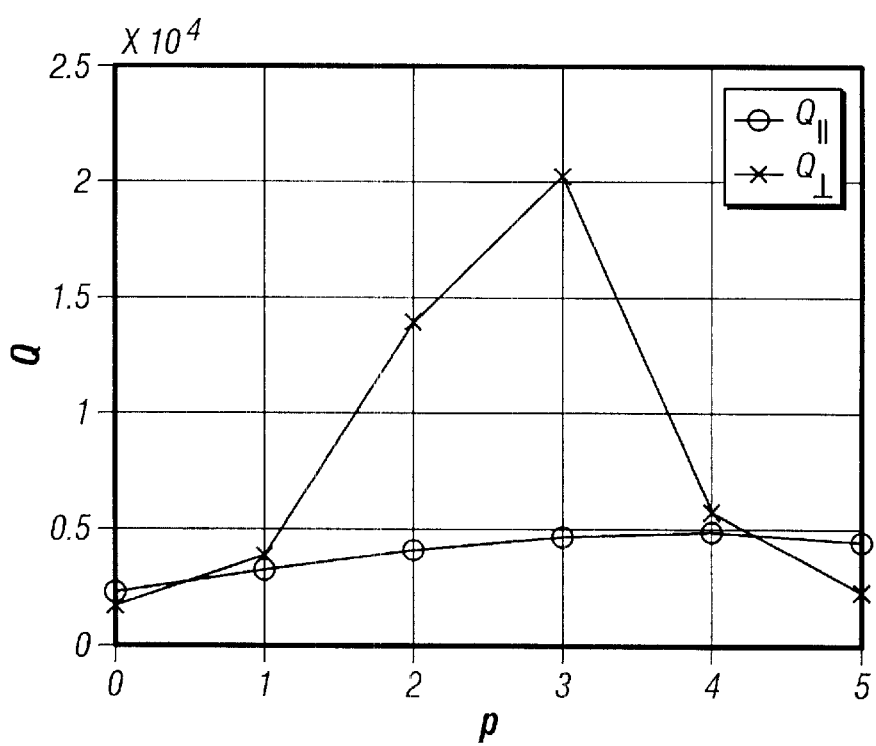
FIG. 5a is a graph of Q factors and FIG. 5b is a graph of frequencies of x-dipole modes in the structure shown in FIG. 4, as a function of the elongation parameter p.
Figure 5B:
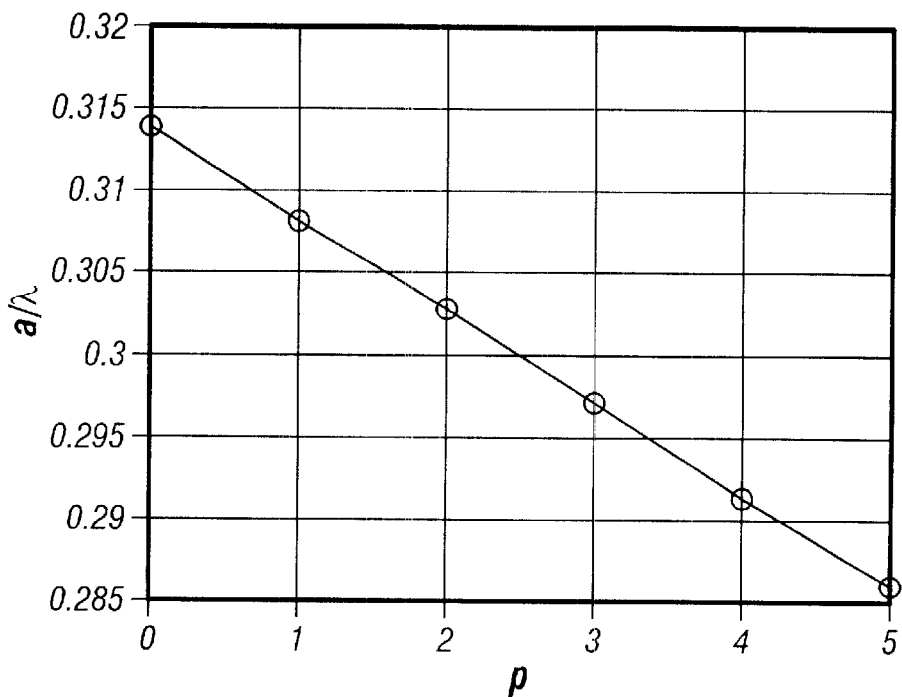

Let us now determine whether the elongation of the central row of holes along the y axis according to the invention may actually improve the Q factor of the x dipole mode just analyzed. A possible disadvantage of this approach is the excitation of acceptor states caused by enlarging holes in the central row. We analyzed how a/$\lambda$ and Q of the x-dipole mode in this structure changes as a function of the elongation parameter p. The results are shown in FIGS. 5a and 5b. It is interesting that the frequency of the mode decreases as p, the number of points of elongation, increases, even though the amount of the low refractive index material increases. However, the net amount of low refractive index material does not matter. What does matter is where the low refractive index is positioned, relative to the unperturbed photonic crystal. The explanation of the decrease in frequency is very simple, if we recall the x-dipole mode pattern shown in FIG. 3a. This is a donor type defect mode, that concentrates its electric field energy density in low refractive index regions of the unperturbed photonic crystal. As p increases, layers of photonic crystal holes 18 are moved away from the defect in y direction. For example, the n-th layer of holes 18 parallel to the x axis will be positioned at y=±na√3/2±p/2, instead of y=±na√3/2. Therefore, a large refractive index material will be positioned at places where the mode expects to "see" air, leading to a decrease in mode's frequency. By tuning the mode's frequency across the bandgap, we can also tune its Q factor.

For p=3, $Q_\perp$ reaches the value of 20000. Unfortunately, at this time, it is not well understood how to control the refractive index of a single photonic crystal hole 18 during the fabrication. For that reason, consider below the alternative method of forming single defect microcavities, which are much easier to construct by microfabrication.

Even after the elongation of holes on the x axis by one point, Q factors of 30000 were not obtained. This means that the application of mirror boundary conditions at x=0 and y=0 planes causes additional effects that lead to the overestimation of Qs. One of the reasons may be that the excited dipole mode is not perfectly symmetric, as described by the applied combination of boundary conditions. This may be partly due to the structure imperfection caused by discretization. In order to avoid problems caused by boundary conditions, all the calculations here are done by applying the even mirror symmetry to z=0 plane only in order to select TE-like modes, and to reduce the computation size by one half. Absorbing boundary conditions are applied to all boundaries in x and y directions and to the upper boundary in the z direction. To prove that the application of mirror boundary conditions at the lower z boundary does not change Q, we also analyzed the entire structure, with absorbing boundary conditions applied to all boundaries and obtained the same results as in the analysis of one half of the structure.

B. Reducing The Radius of a Single Hole

Microcavities 12 analyzed in this embodiment are formed by reducing the radius of a single hole 18 to $r_{def}$. We calculate parameters of excited dipole modes for a range of microcavity parameters and results are shown in Table I. For all tabulated results, 5 layers of holes surround the defect, a=20 and the initial field distribution is not symmetric, leading to the excitation of both x and y dipole modes.

TABLE I

| r/a | $R_{def}$/a | d/a | a/λ | $Q_{II}$ | $Q_\perp$ |
|---|---|---|---|---|---|
| 0.25 | 0.15 | 0.75 | 0.277 | 230 | 1840 |
| 0.25 | 0.2 | 0.75 | 0.284 | 116 | 3190 |
| 0.275 | 0.15 | 0.75 | 0.286 | 778 | 920 |
| 0.275 | 0.2 | 0.75 | 0.297 | 470 | 2078 |

The calculated Qs are not large, but they provide us with a good starting point for the further optimization.

Figure 6:
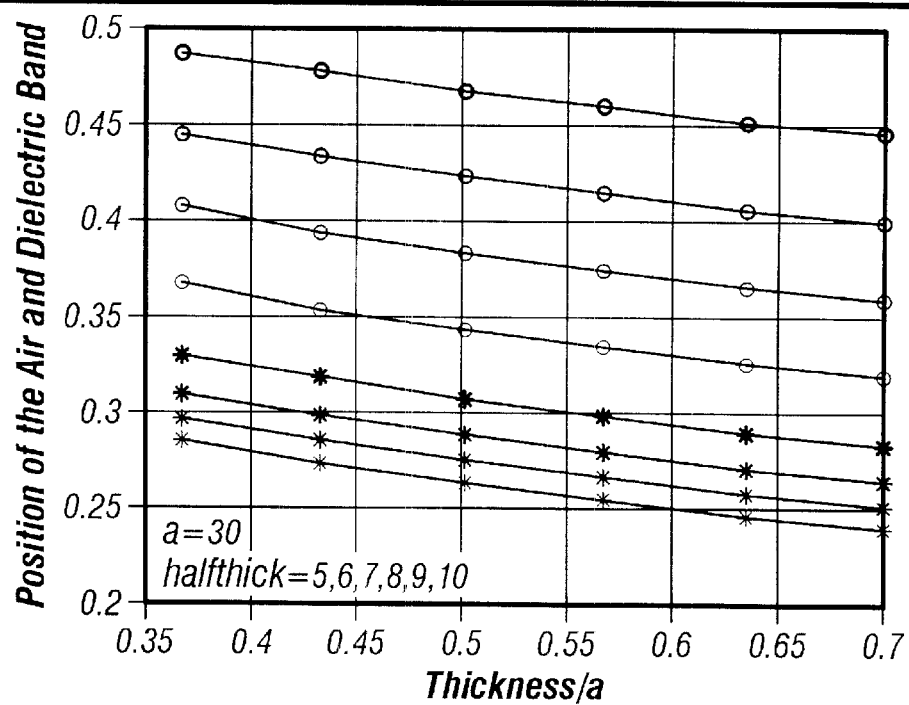

The dispersion diagram for TE like modes dramatically changes by varying d/a and r/a. The calculated band-gap edges as a function of photonic crystal parameters and for $n_{slab}$=3.5 are shown in FIG. 6. The increase in r/a in the analyzed range leads to the increase in the band gap and the reduction in lateral losses. However, vertical scattering at the edges of holes 18 increases and $Q_\perp$ drops. Therefore, it is important to find an optimum r/a which leads to small vertical losses, but preserves good lateral confinement, in order not to increase the mode volume too much.

Figure 7:
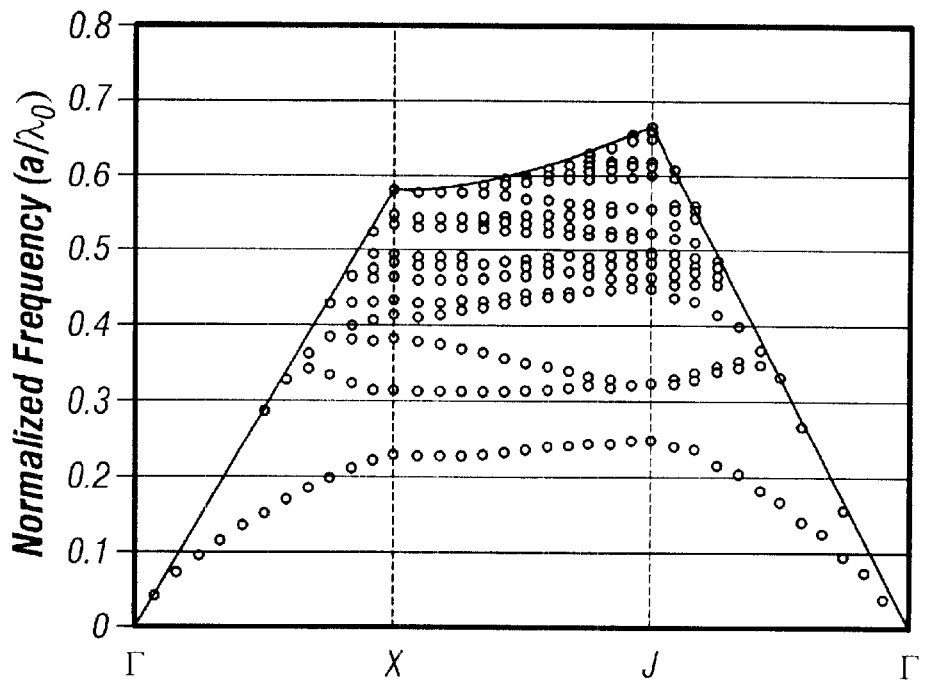
FIG. 7 is a band diagram for TE-like modes of a thin slab (n=3.4, d/a=0.75) surrounded by air on both sides and patterned with a hexagonal array of air holes (r/a=0.275).

The band diagram for TE-like modes of a thin slab (n=3.4, d/a=0.75) surrounded by air on both sides and patterned with a hexagonal array of air holes (r/a=0.275) is shown in FIG. 7. These photonic crystal parameters are used in most of the calculations below. From the comparison of the dipole mode frequencies tabulated in Table I and the band diagram shown in FIG. 7, it can be seen that these cavities operate at frequencies close to the bottom of the air band. In this region, the mode penetrates more into the photonic crystal and the mode volume increases. However, vertical losses can be reduced at the expense of this increase in the mode volume. On the other hand, the lateral quality factor can always be improved by increasing the number of photonic crystal layers around the defect, until a point when the total quality factor is purely determined by vertical losses. This is used when designing cavities for strong coupling. See FIG. 12.

III. Cavities For Strong Coupling

Consider now the design of photonic crystal microcavities 12 according to the invention to achieve strong coupling between the cavity field and a single 'gas-phase' atom, that is, an atom located in free space rather than contained as an impurity in the dielectric slab. What is of interest is the photonic bandgap structures for single-atom cavity quantum electrodynamics in the strong coupling regime. For this purpose, the microcavity mode quality factor (Q) has to be as large as possible and the mode volume ($V_{mode}$) as small as possible.

These two design rules are also followed when designing photonic crystal microcavities for semiconductor lasers. However, in a cavity 12 for strong coupling, an atom must be trapped at the point where it interacts most strongly with the cavity field. Therefore, an additional design goal is imposed in this case: the cavity mode should have the highest E-field intensity in the air region. When designing a laser cavity, the problem is the opposite: one tends to maximize the overlap between the gain region and the cavity field and, therefore, wants to have the strongest E-field in the semiconductor region.

For all calculations in this section, $n_{slab}$=3.4, five layers of holes surround the central hole 14 and a=20. Mode volume ($V_{mode}$), critical atom ($N_0$) and photon ($m_0$) numbers are defined as follows:

$$V_{mode} = \frac{\iiint \varepsilon(r)|E|^2 dV}{\max[\varepsilon(r)|E|^2]}$$

$$N_0 = \frac{2\kappa\gamma_\perp}{g^2}$$

$$m_n = \left(\frac{\gamma_\perp}{2g}\right)^2$$

where γ is the cavity field decay rate, proportional to the ratio of the angular frequency of the mode ($\omega_0$) and the mode quality factor (Q):

$$\kappa = \frac{\omega_0}{4\pi Q}$$

$\gamma_{195}$ is the atomic dipole decay rate (2.6 MHz for Cesium) and g is the coupling parameter at the point where we want to put an atom:

$$g(r) = g_0 \frac{\varepsilon(r)|E|}{\max[\varepsilon(r)|E|]}$$

$g_0$ denotes the vacuum Rabi frequency:

$$g_0 = \gamma_\perp \sqrt{\frac{V_0}{V_{mode}}}$$

$$V_0 = \frac{c\lambda^2}{8\pi\gamma_\perp}$$

Strong coupling is possible if both $N_0$ and $m_0$ are smaller than 1. Therefore, in order to predict whether the strong coupling can occur, we must calculate upper limits of $N_0$ and $m_0$ and compare them to 1. In other words, it is acceptable if calculated critical numbers are overestimated. As the number of photonic crystal layers around the defect increases, the total quality factor Q approaches $Q_\perp$ and $V_{mode}$ drops due to the better lateral confinement. Hence, we can calculate $N_0$ and $m_0$ by assuming $Q=Q_{195}$ and using $V_{mode}$ calculated for 5 photonic crystal layers around the defect. This can only cause a slight overestimation of $N_0$ and $m_0$.

The material and photonic crystal properties are chosen in such a way that cavities 12 operate at $\lambda=852$ nm which is the wavelength corresponding to the atomic transition in $^{133}Cs$.

A. Single Defect with Elongation of the Central Row of Holes

Figure 8:
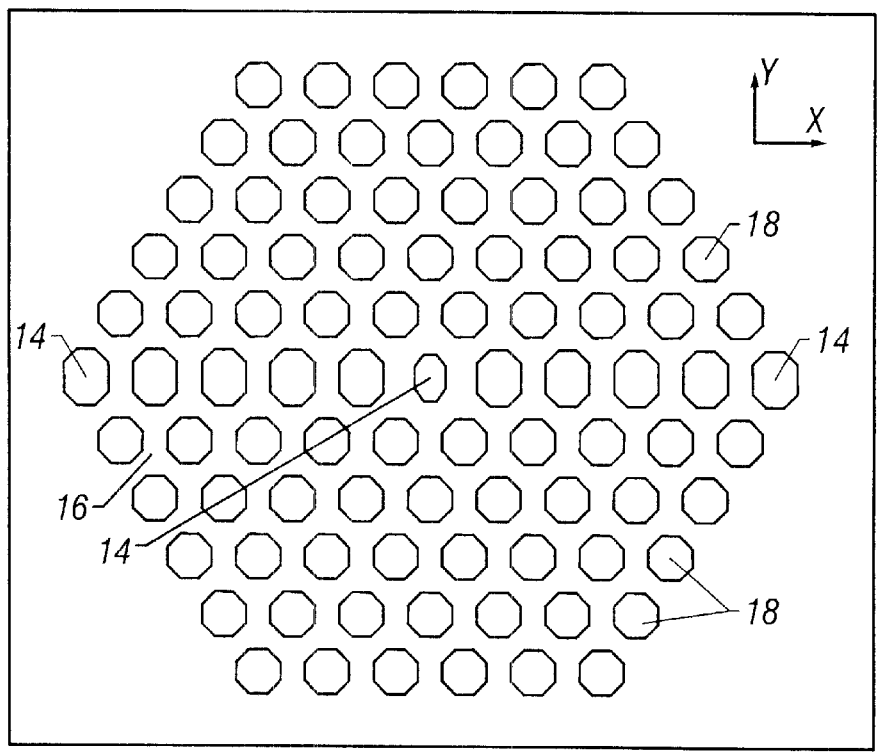
FIG. 8 is a two dimensional diagram of a single defect produced by reducing the radius of the central hole to $r_{def}$/a=0.2 from r/a=0.275. Holes along the x axis are elongated in the y direction by 4 points, in such a way that the distance between holes is preserved. a=20 in the applied discretization.
Figure 9A:
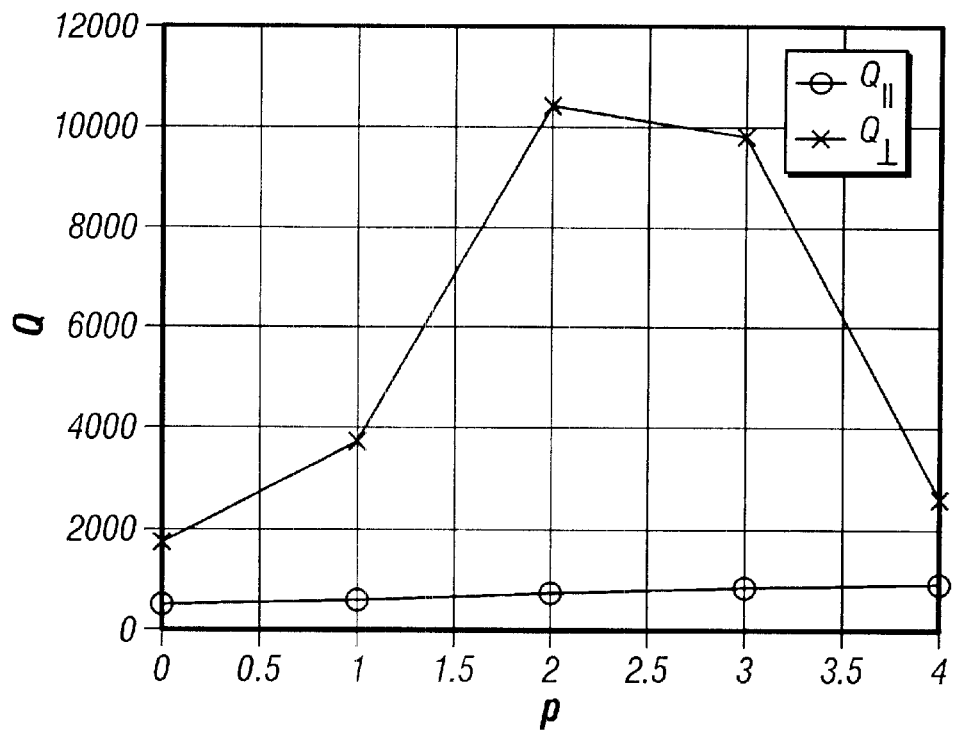
FIGS. 9a and 9b are graphs of Q and a/λ as a function of p. The parameters are for the x dipole mode in the single defect structure (r/a =0.275, d/a=0.75 and $r_{def}$/a=0.2) with FIG. 9a showing the Q factors and FIG. 9b showing frequency in units a/λ as a function of the elongation parameter p.
Figure 9B:
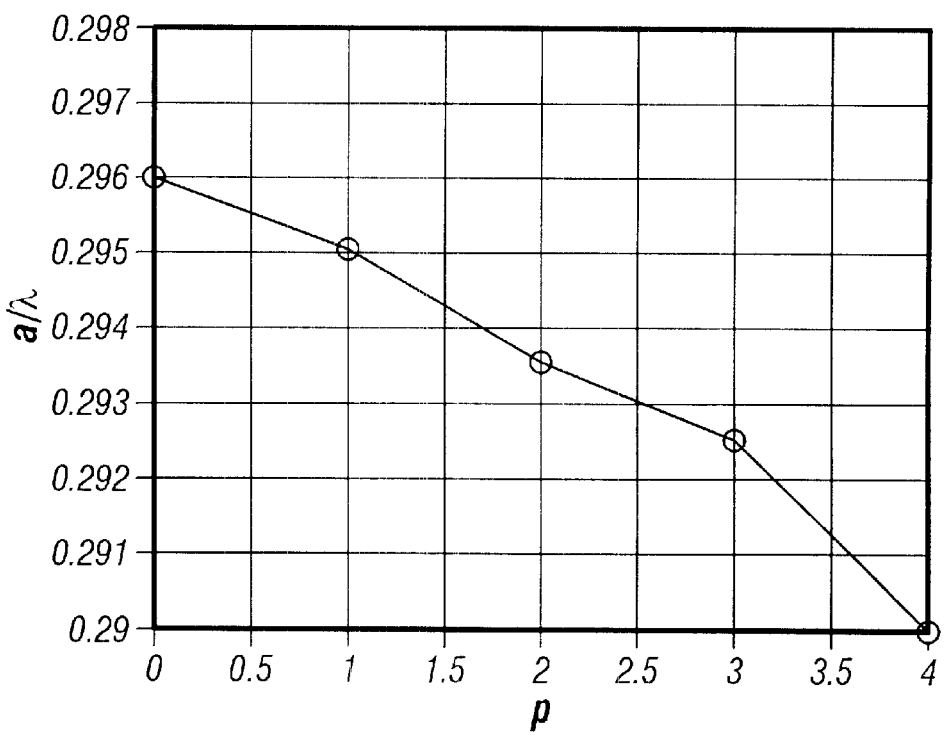
Figure 10A:
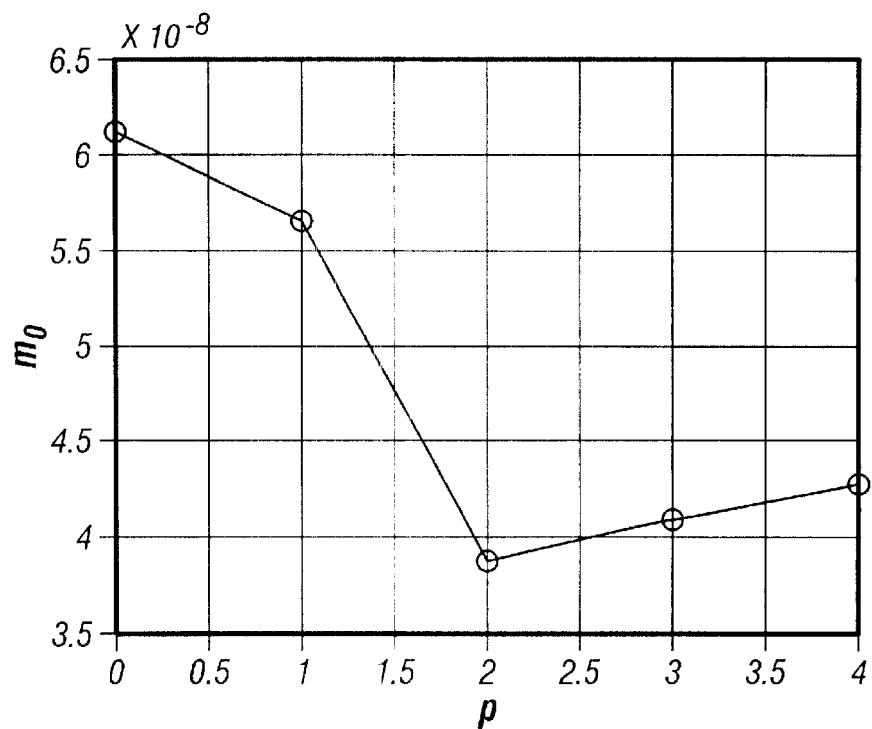
FIGS. 10a and 10b are graphs of $m_0$ and $N_0$ respectively as a function of the elongation parameter p with the parameters of the x dipole mode in the single defect structure be given as r/a=0.275, d/a=0.75 and $r_{def}$/a=0.2.
Figure 10B:
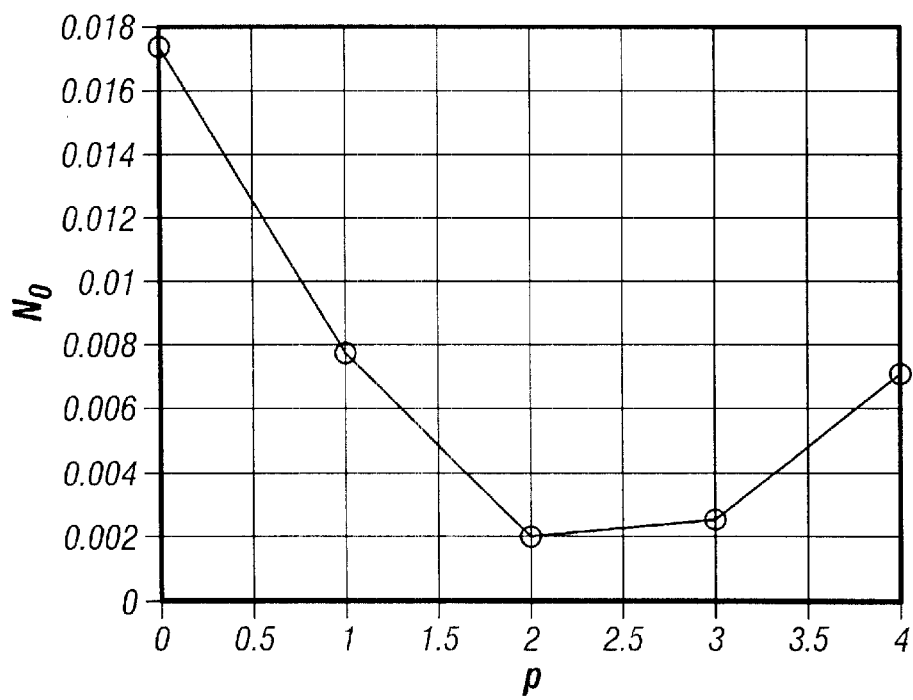

Consider now microcavities 12 formed by reducing the radius of a single hole 18 and simultaneously elongating by p points holes 18 positioned along the x axis in the y direction, as shown in FIG. 8. The distance between holes 18 is preserved. This is similar to the effect produced by application of our even mirror boundary conditions at y=0 plane, which were discussed in the previous section. The elongation is used to tune the frequency of the defect mode across the bandgap, in order to optimize its Q values. We will calculate the dependence of the x-dipole mode properties on parameter p. Parameters of the unperturbed photonic crystal are: r/a=0.275, d/a=0.75, a=20 and the defect hole radius is $r_{defect}=0.2$. QII, $Q_{195}$, a/$\lambda$ and critical atom ($N_0$) and photon ($m_0$) numbers as a function of the elongation parameter p for the x-dipole mode are shown in FIGS. 9 and 10. $V_{mode}$ did not change significantly with p and it was approximately equal to $0.1(\lambda/2)^3$ for all structures. When p increases, the frequency of the mode moves away from the band edge, towards the center of the band gap, and its $Q_{//}$ increases.

Figure 11A:
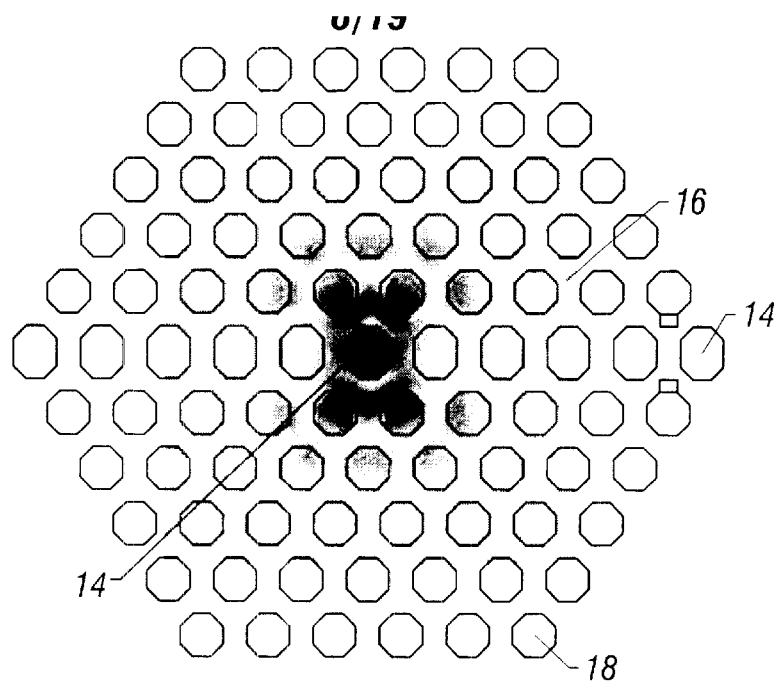
FIGS. 11a and 11b are diagrams of the electric field intensity pattern of the x-dipole mode excited in the microcavity formed by reducing the radius of a single hole and simultaneously elongating holes on the x axis by 2 points.
Figure 11B:
Figure 12:
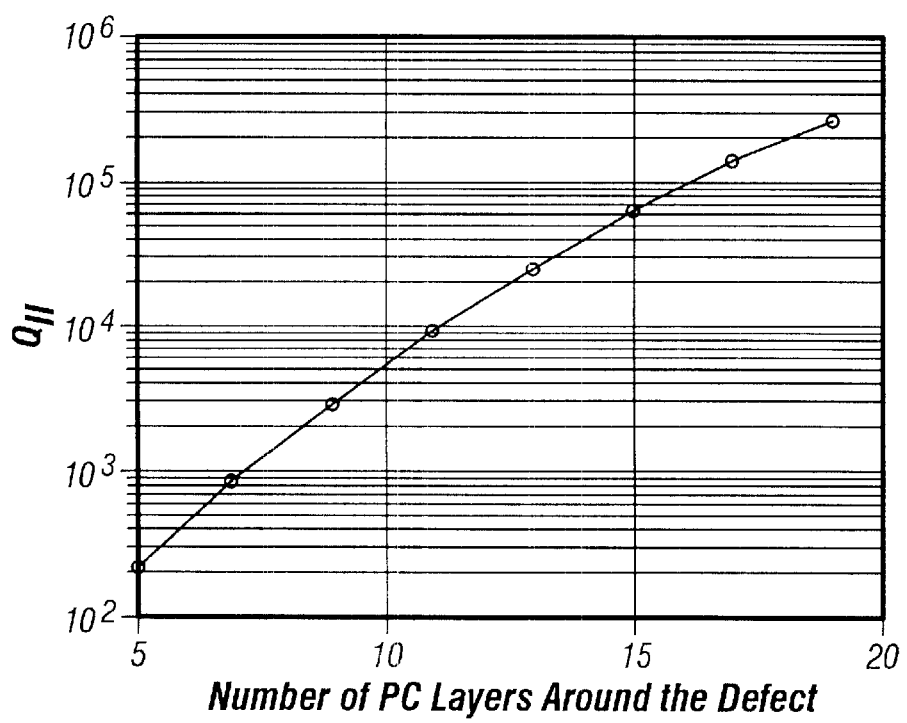
FIG. 12 is a graph of $Q_{||}$ of the x dipole defect mode, as a function of the number of photonic crystal layers surrounding the defect. The analysis is done for the single defect structure (r/a=0.275, $r_{def}$/a=0.2, p=2 and the average refractive index of the structure is n=2.76.

From the electric field intensity pattern of the x-dipole mode shown in FIG. 11, one can see that the electric field intensity is strongest within the defect hole 14. Therefore, an atom should be trapped there in order to interact most strongly with the cavity field. From the calculated critical atom and photon numbers, it then should be possible to achieve a very strong coupling. At $\lambda=852$ nm, the parameters of such a cavity are r=70 nm, d=190 nm, a=250 and $r_{defect}=50$ nm. Due to extremely small mode volumes in these cavities, strong coupling is possible even for moderate values of Q factors, as can be seen in FIGS. 9 and 10. Furthermore, $m_0$ is much smaller than $N_0$, which means that we can try to improve Q factors further, at the expense of increasing $V_{mode}$. Calculated lateral quality factors ($Q_{//}$) are much smaller than vertical ones ($Q_{195}$), since the cavities operate very close to the edge of the air band and only 5 photonic crystal layers surround the defect 14. However, by increasing the number of photonic crystal layers around the defect 14, we can increase $Q_{//}$ above $Q_{195}$ and make the total Q factor of the cavity determined by $Q_{195}$ only. To prove that this is valid, we analyzed how $Q_{//}$ of this cavity (for p=2) depends on the number of photonic crystal layers around the defect 14 using the two dimensional FDTD. The average refractive index used in this analysis was n=2.76 and the result is shown in FIG. 12. Therefore, for more than 15 photonic crystal layers around the defect 14, a $Q_{//}$ larger than 50000 can be achieved. $Q_{//}$ in two dimensions is more than two times smaller than in the original three dimensional analysis for 5 photonic crystal layers, due to the mismatch between the effective refractive index in two dimensional analysis and the analyzed three dimensional structure.

B. Tuning Holes Around the Defect

Figure 13:
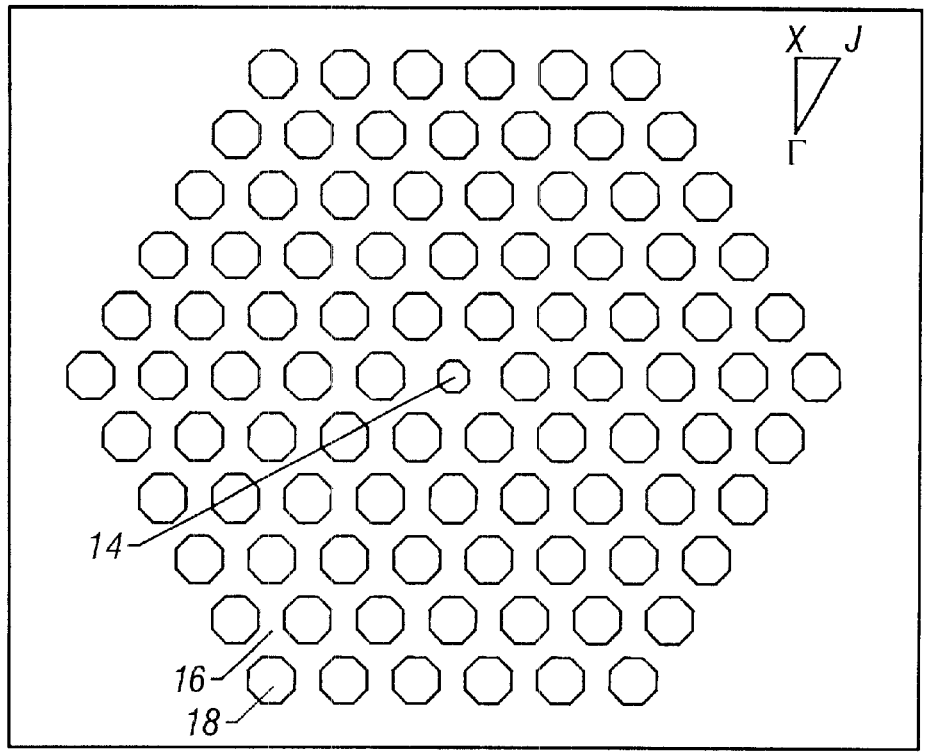
FIG. 13 is a two dimensional diagram showing the tuning of the four holes closest to the defect in ⌈J direction. Their radii are reduced to $r_1$ and they are simultaneously moved away from the defect in ⌈J direction by r-$r_1$. The radius of the central hole is $r_2$.
Figure 14:
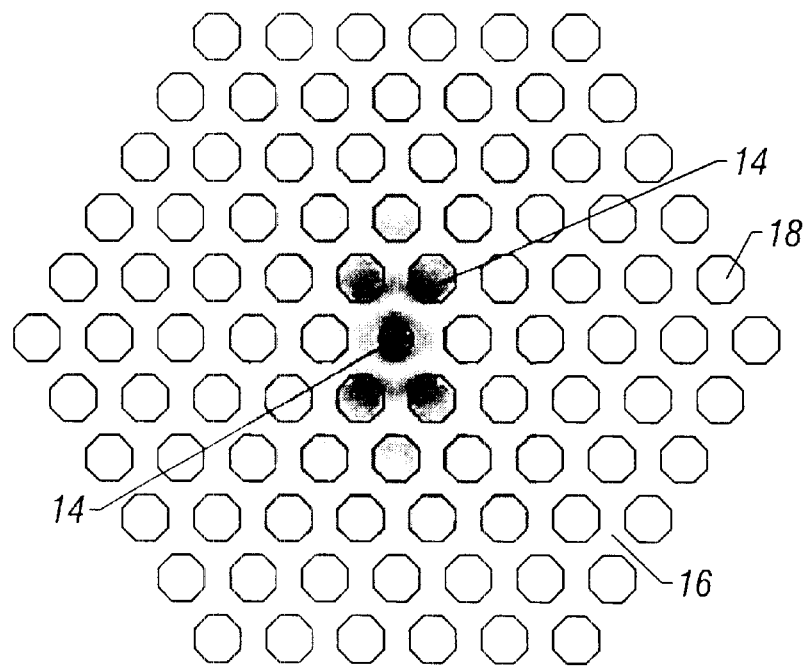
FIG. 14 is a two dimensional electric field intensity pattern of the y dipole mode excited in the cavity where four holes closest to the defect in ⌈J direction are tuned. Their radii are reduced to $r_1$/a=0.225 and they are simultaneously moved away from the defect in ⌈J direction by r-$r_1$. The radius of the central hole is $r_2$/a=0.2. Photonic Crystal parameters are r/a=0.275 and d/a=0.75.
Figure 15:
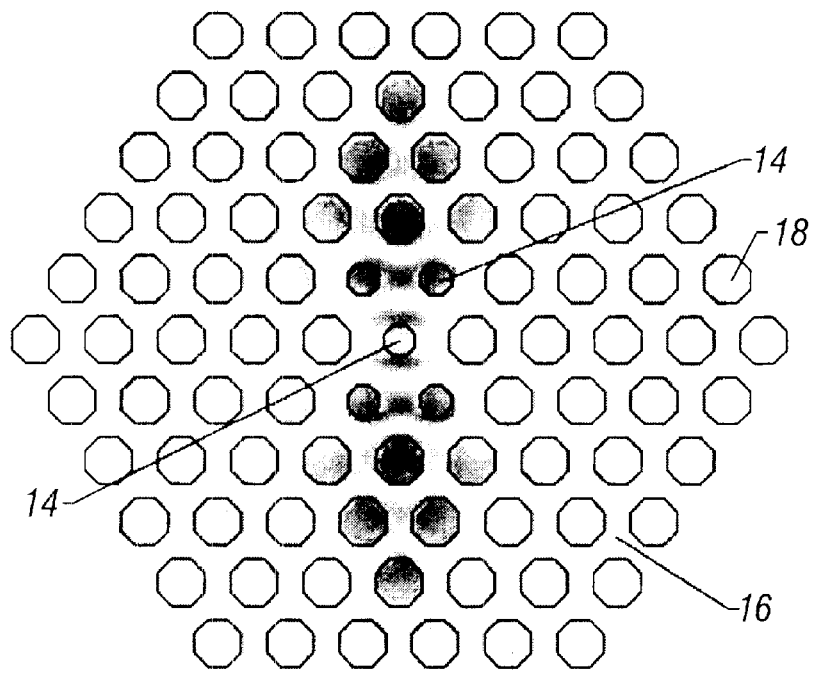
FIG. 15 is a two dimensional diagram of the electric field intensity pattern of the shallow donor mode excited in the cavity with the same parameters as the one shown in FIG. 14.

Dipole modes are very sensitive to the geometry of holes 18 closest to the defect 14. By tuning these holes 18, we can induce frequency splitting of dipole modes and dramatically influence their Q factors. Here, we will test the influence of changing the 4 holes closest to the defect in ⌈J direction as depicted in FIG. 13. The analyzed structure is shown in FIG. 13. The radius of the central hole 14 is reduced to $r_2$ and the radii of the four closest holes in ⌈J direction are reduced to $r_1$. These four holes are simultaneously moved away from defect 14, by $r-r_1$ in ⌈J direction, which preserves the distance between them and the next nearest neighbors in the same direction. This design will improve the Q factor of the y-dipole mode and spoil the Q of the x-dipole mode. We analyzed structures with various parameters, but our best result was obtained for r/a=0.275, d/a=0.75, $r_2$/a=0.2, $r_1$/a=0.225 and a=20. The electric field intensity pattern of the excited y-dipole mode is shown in FIG. 14, and its calculated parameters are a/$\lambda$=0.289, $Q_{195}$=4890 and $Q_{//}$=856. From Table I we can see that a dipole mode excited in a single defect microcavity 12 with this $r_2$/a, r/a, d/a had $Q_{195}$=2078. Therefore, the tuning of four holes can lead to a substantial increase in Q of the x dipole mode. The disadvantages of this design include the excitation of defect modes other than dipoles coming from variation of several holes 18, such as the shallow donor mode shown in FIG. 15.

Figure 16:
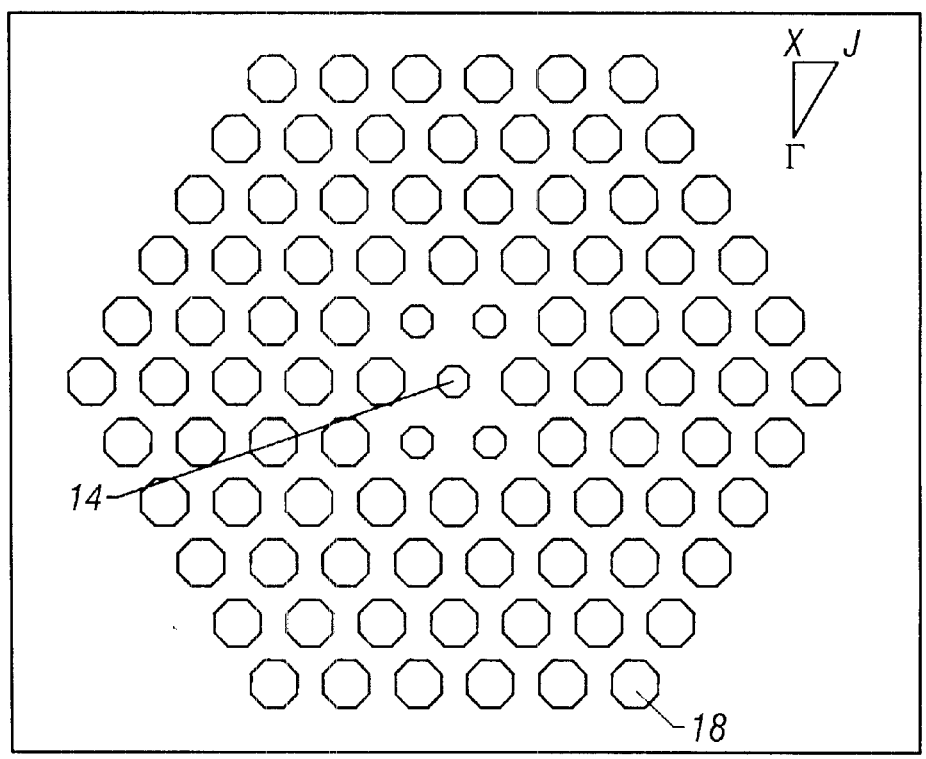
FIG. 16 is a two dimensional diagram showing the tuning of the four holes closest to the defect in ⌈J direction. Their radii are reduced to $r_1$ and they are simultaneously moved away from the defect in ⌈J direction by r-$r_1$. The radius of the central hole is $r_2$. Beside that, holes on the y axis are elongated by p=2 points in the x direction in such a way that half-spaces x>p/2 and x<p/2 remain unperturbed.
Figure 17A:
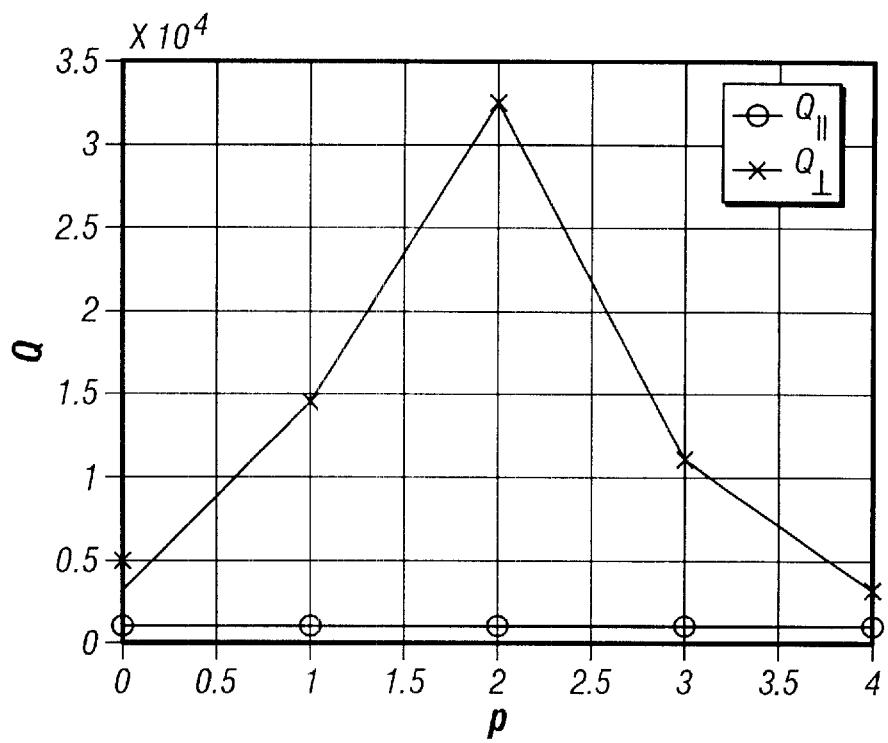
FIGS. 17a and 17b are graphs of the Q factors and frequency in units a/λ respectively as a function of the elongation parameter p. The parameters are those of the x dipole mode in the structure where four holes in ⌈J direction are tuned as shown in FIG. 13.
Figure 17B:
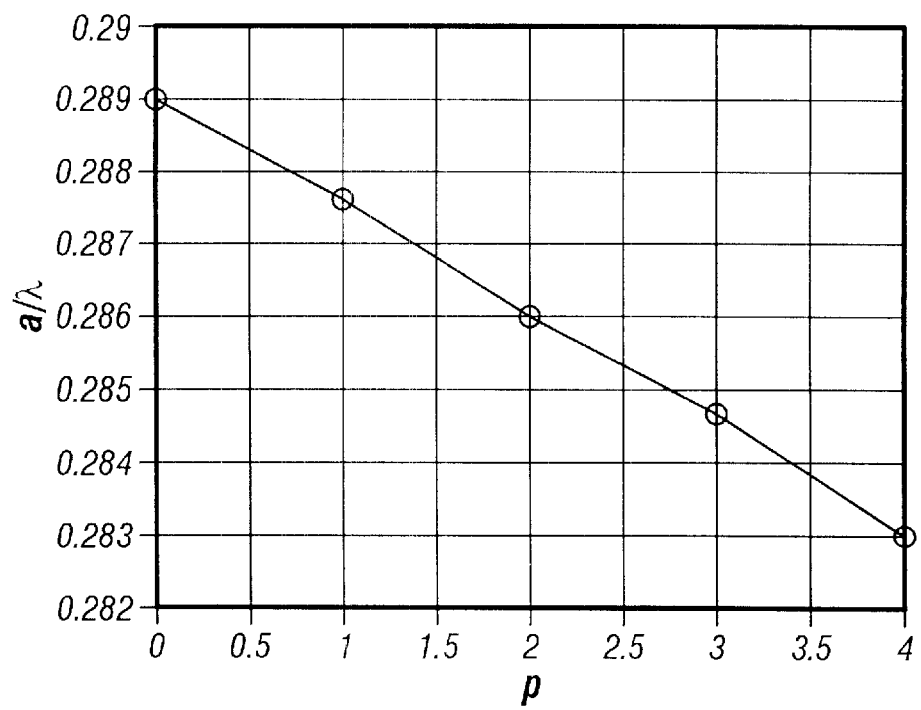
Figure 18:
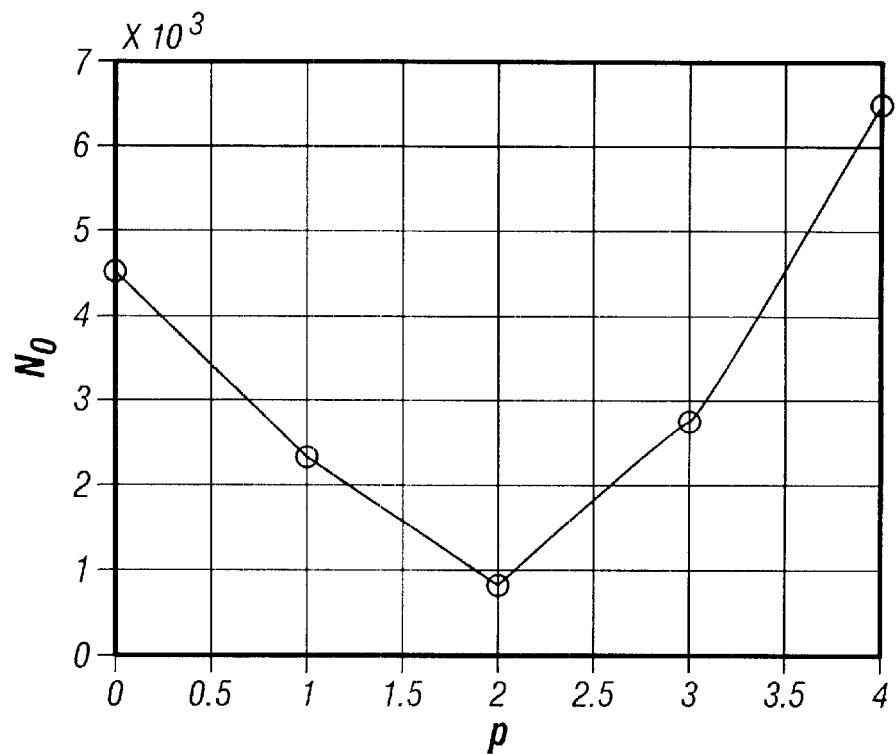
FIG. 18 is a graph of $N_0$ of the x dipole mode in the structure as a function of the elongation parameter p, where four holes in the ⌈J direction are tuned as shown in FIG. 13.

Let us try to improve Q of this cavity 12 even further by also employing the idea of elongation of holes 18 along desired directions. Our mode of choice is the y dipole and we will elongate holes sitting on the y axis by p points in the x direction, as shown in FIG. 16. Distance between holes 18 is preserved in this process, i.e. half-planes x>p/2 and x<p/2 are identical to x>0 and x<0 half-planes of the previously analyzed structure without elongation of holes shown in FIG. 13. The dependence of the mode frequency, Q and $N_0$ on parameter p is shown in FIGS. 17 and 18. $V_{mode}$ did not change significantly with p and was in the range between $0.09(\lambda/2)^3$ and $0.12(\lambda/2)^3$. The calculated $m_0$ was around $5 \cdot 10^{-8}$ for all structures. Again, a very strong coupling is achievable by this design.

C. Coupled Dipole Defect Modes

The significance of surface effects that could perturb atomic radiative structure within the small defect hole 14 is still not well understood. For that reason, we will try to investigate ways of increasing the radius of the hole 14 where the coupling between the atom and the cavity field should occur. Let us now analyze the cavity design where the strong E-field intensity can be achieved in the center of an unperturbed hole 18. The idea is to use coupling of two dipole defect states.

Figure 19A:
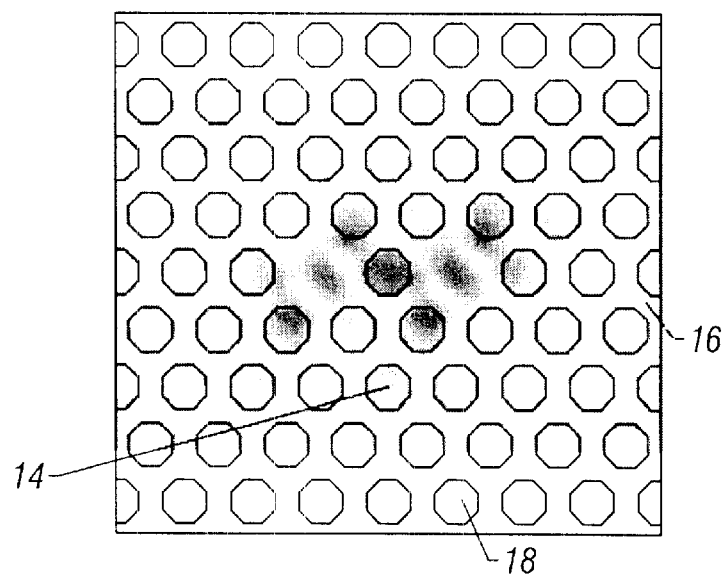
FIGS. 19a and 19b are two dimensional diagrams depicting the electric field intensity patterns of the coupled dipole modes.
Figure 19B:
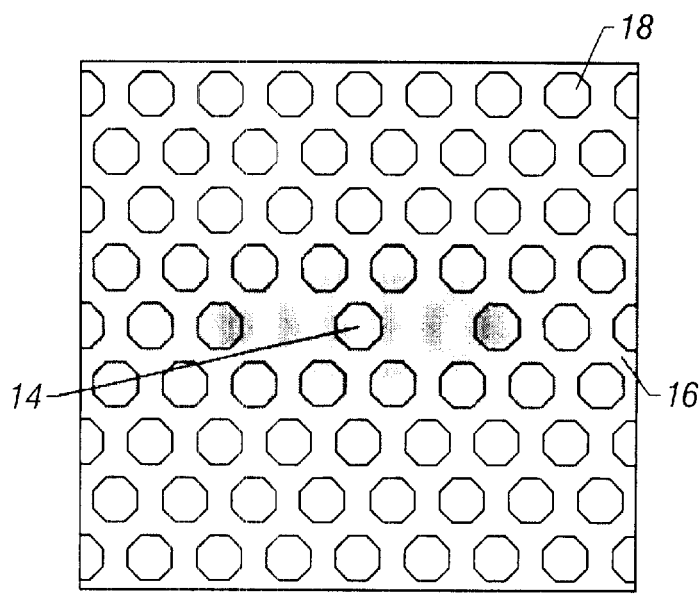

Resonant modes of the microcavity 12 formed by coupling two single defects are presented in FIG. 19. Based on the resultant electric field intensity in the central, unperturbed hole, we call them constructively or destructively coupled defect states. They have different frequencies, as well as Q factors. We will analyze properties of the constructively coupled state, since the central, unperturbed hole would be a good place for an atom.

Figure 20:
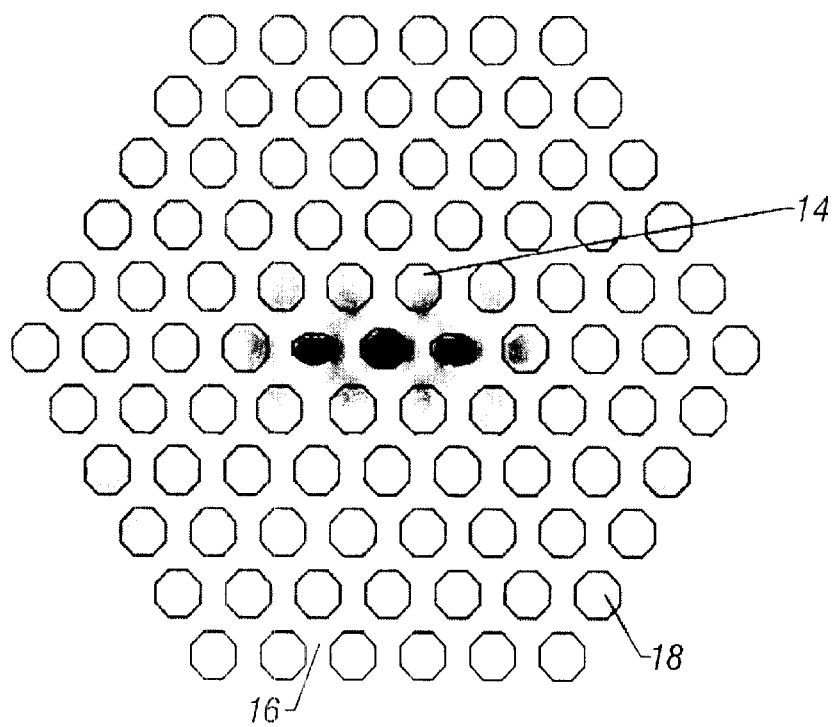
FIG. 20 is a two dimensional diagram depicting the electric field intensity pattern of constructively coupled dipole modes in a structure which has been elongated in the X direction with the parameters: $r_{def}$/a=0.2, d/a=0.75, r/a= 0.275 and a=20.

We analyzed a series of structures with different parameters. The best results were obtained for two coupled defects with $r_{defect}$/a=0.2 in a photonic crystal with the following parameters: d/a=0.75, r/a=0.275 and a=15. Holes 18 in the ⌈X direction, in columns containing defects, are elongated by 2 points in the X direction. The mode pattern of the constructively coupled defect state is shown in FIG. 20. Parameters of the mode are: a/$\lambda$=0.29, $Q_{//}$=580, $Q_{195}$=6100, $V_{mode}$=0.19 $(\lambda/2)^3$, $m_0$=1.5×10$^{-7}$ and $N_0$=0.0135. An atom can now be trapped in the central hole of unperturbed radius. For $\lambda$=852 nm, this radius is r=68 nm, which is a significant improvement over the previous design, where an atom must be trapped within a 50 nm radius hole. Again, a strong coupling is achievable in this cavity 12.

Figure 21:
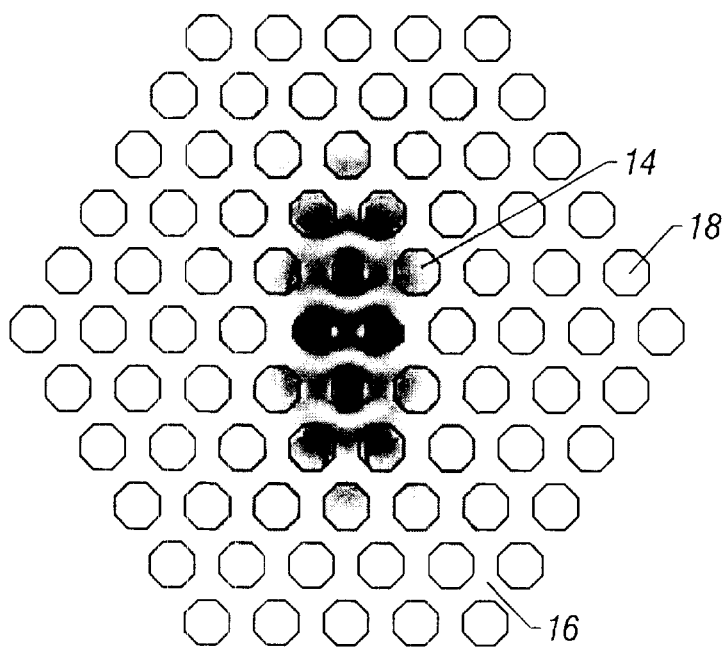
FIG. 21 is a two dimensional diagram depicting the electric field intensity pattern of constructively coupled dipole modes in a structure which has been elongated in the Y direction with the same parameters of FIG. 20.
Figure 22A:
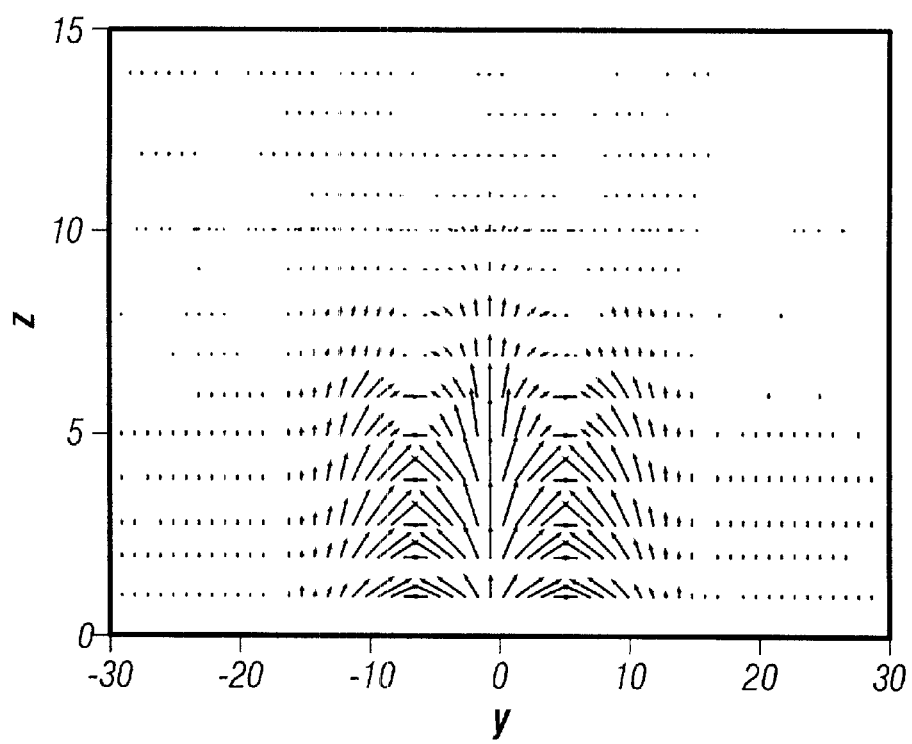
FIGS. 22a and 22b are graphs of the projection of the Poynting Vector, ⌈, into the y-z plane as shown in FIG. 22a and into the x-z plane as shown in FIG. 22b and through the center of the defect at (0,0,0). The parameters are the same as those chosen for FIG. 3 and half of the memb*rane extends from z=1 to z=4.
Figure 22B:
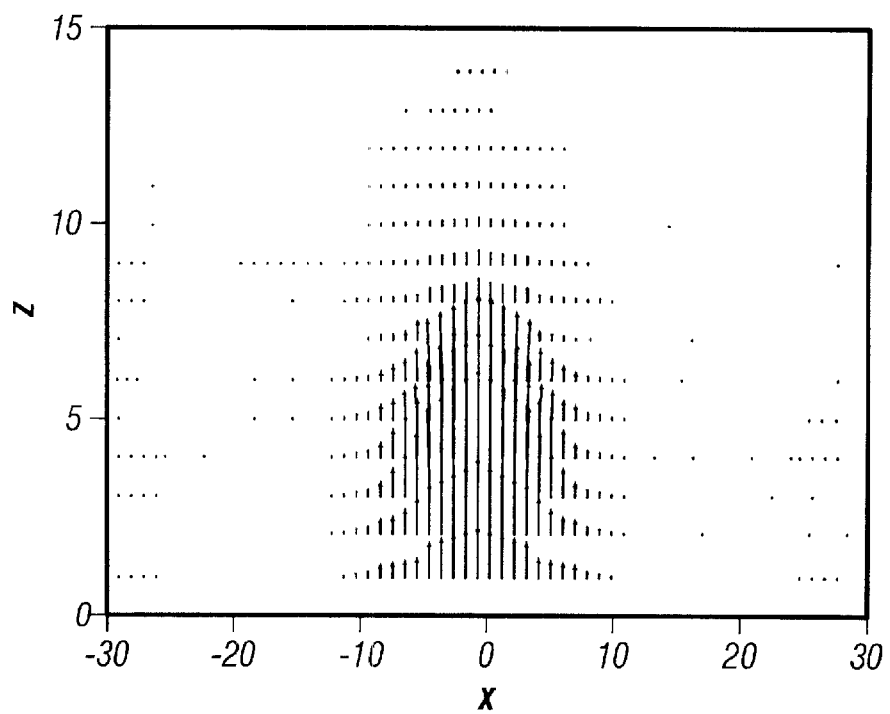
Figure 23A:
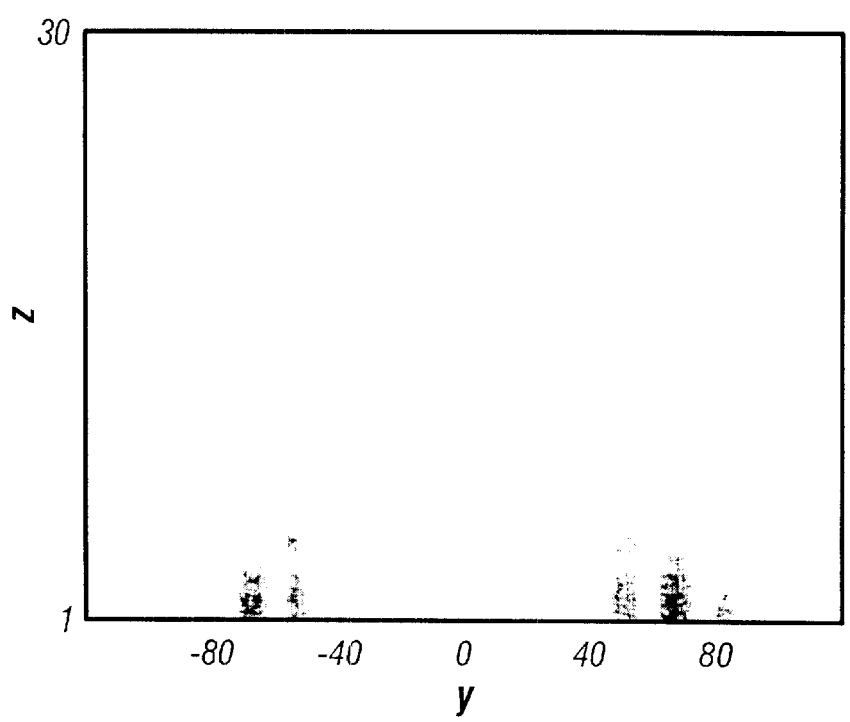
FIGS. 23a, 23b and 23c are graphs of the intensity of the Poynting vector, ⌈, at the x boundary as shown in FIG. 23a, at the y boundary as shown in FIG. 23b, and at the z boundary as shown in FIG. 23c for the x dipole of FIG. 3. The half of the membrane extends from z=1 to z=4 and seven photonic crystal layers surround the defect.
Figure 23B:
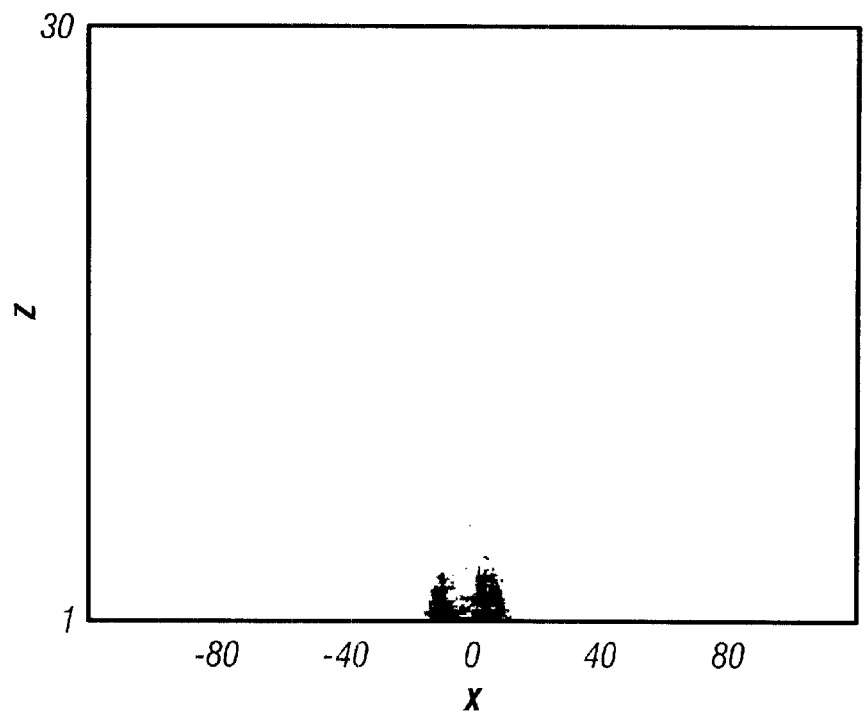
Figure 23C:
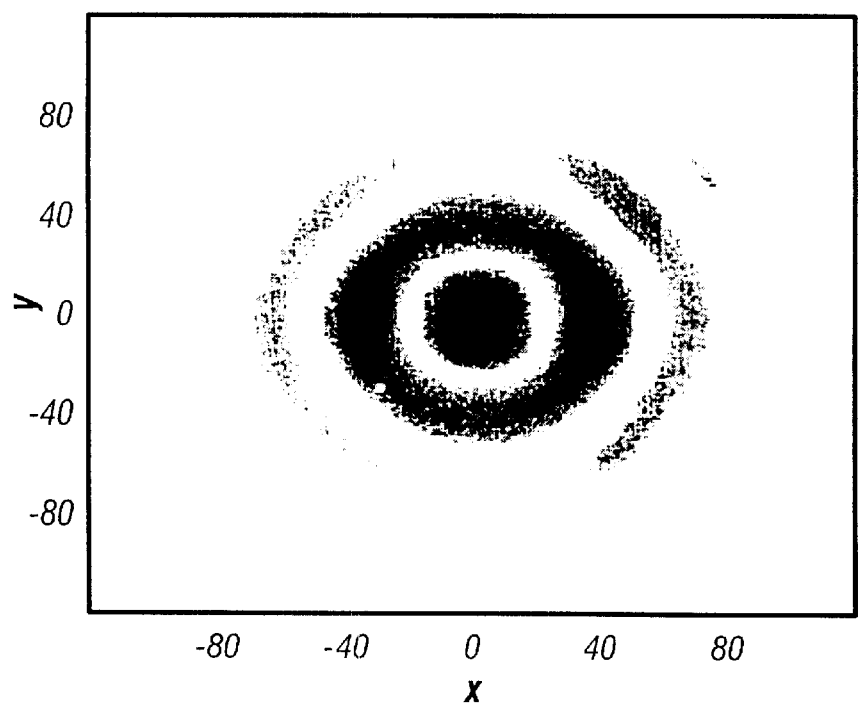
Figure 24:
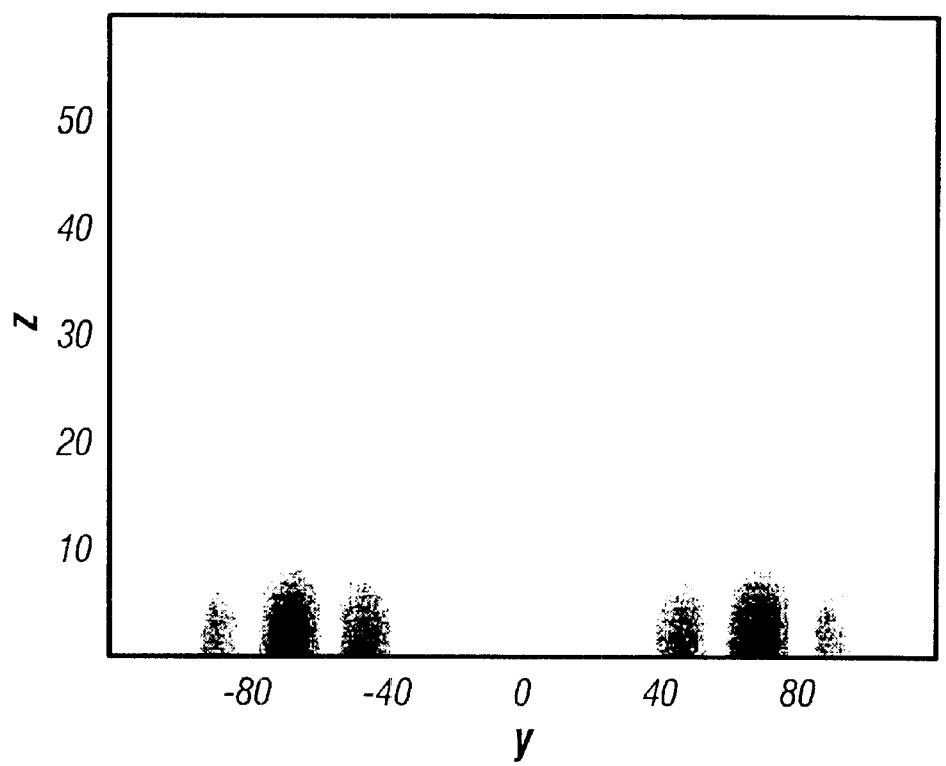
FIG. 24 is a graph of the intensity of the Poynting vector, ⌈, at the x boundaries for the x dipole of FIG. 16. The half of the membrane extends from z=1 to z=7 and five photonic crystal layers surround the defect.

An alternative way of forming the coupled defects state is represented in FIG. 21. We used the same photonic crystal parameters as previously: $r_{def}$/a=0.2, d/a=0.75, r/a=0.275 and a=20. Holes in ⌈J direction, in rows containing defects, are elongated by 2 points in the Y direction. The mode pattern of the constructively coupled defect state is shown in FIG. 21. Parameters of the mode are: a/$\lambda$=0.288, $Q_{//}$740, $Q_\perp$=12120, $V_{mode}$=0.14 $(\lambda/2)^3$, $m_0$=1.4×10$^{-7}$ $N_0$=0.0063. Strong coupling is achievable for an atom trapped in any of the two central holes 18' of the unperturbed radius positioned between the defects 14. For $\lambda$=852 nm, this radius is again r=68 nm.

IV. Fabrication

The fabrication procedure for making the cavities described above in AlGaAs is as follows. The material and photonic crystal properties are chosen in such a way that cavities operate at $\lambda=852$ nm which is the wavelength corresponding to the atomic transition in $^{133}$CS.

Figure 26A:
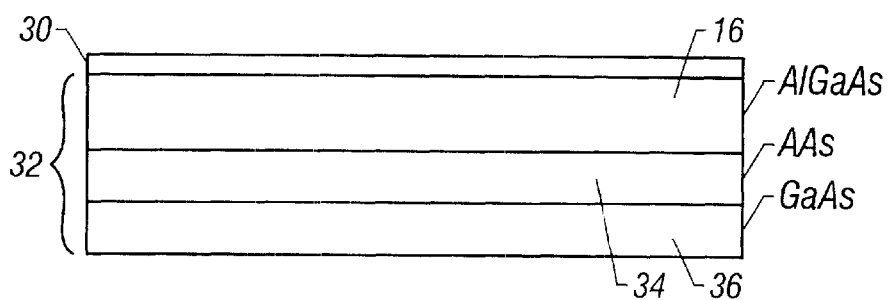
FIGS. 26a, 26b and 26c diagrammatically depict the steps of fabrication process of a microcavity according to the invention.

The fabrication process starts in FIG. 26a by spinning of 100 nm thick high molecular weight PMMA (polymethylmethacrylate) layer 30 on top of the wafer 32. Wafer 32 is comprised of an AlGaAs layer 16, a sacrificial AlAs layer 34 and a GaAs substrate 36. The PMMA layer 30 is subsequently baked on a hot plate at 150° C. for 20 minutes. A desired two dimensional photonic crystal pattern 10 as described in any one of the above embodiments is beam written on the PMMA layer 30 by electron beam lithography using a Hitachi 8-4500 electron microscope.

Figure 25A:
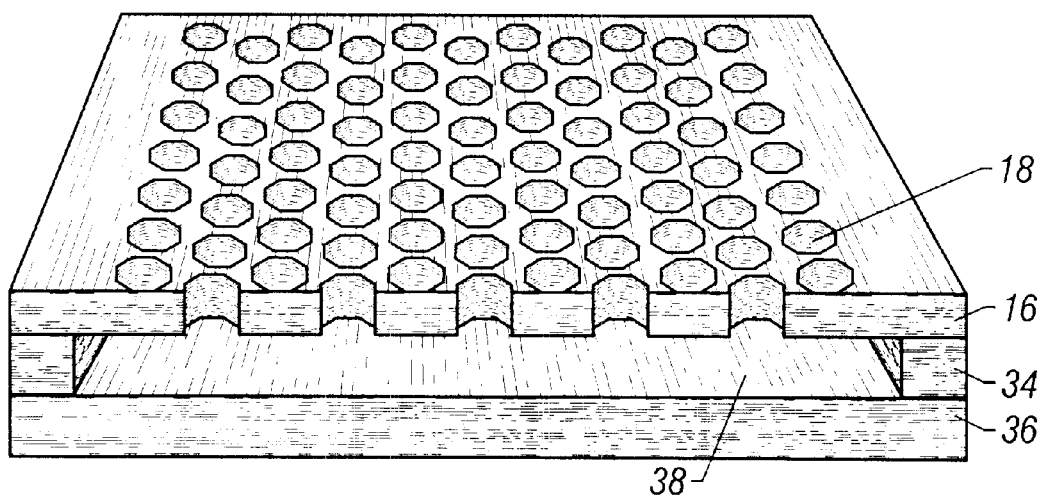
FIGS. 25a, 25b, 25c and 25d show a perspective sectional view of a completed cavity, a top plan SEM view in enlarged scale of the hexagonal hole array, a global top plan SEM view of the hexagonal hole array, and a top plan SEM view in enlarged scale of the hexagonal hole array in which two holes have been omitted from the array.
Figure 25B:
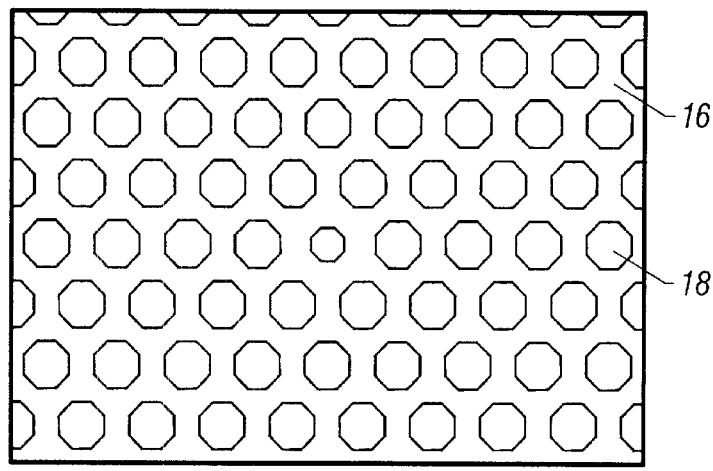
Figure 25C:
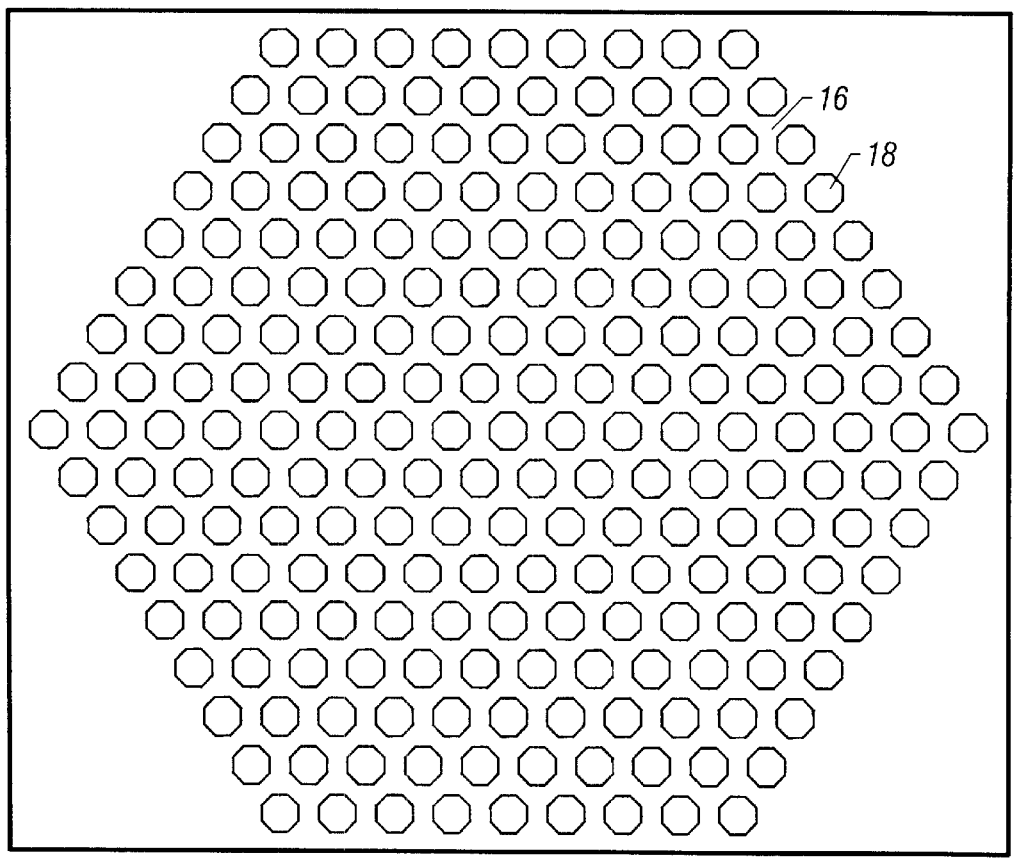
Figure 25D:
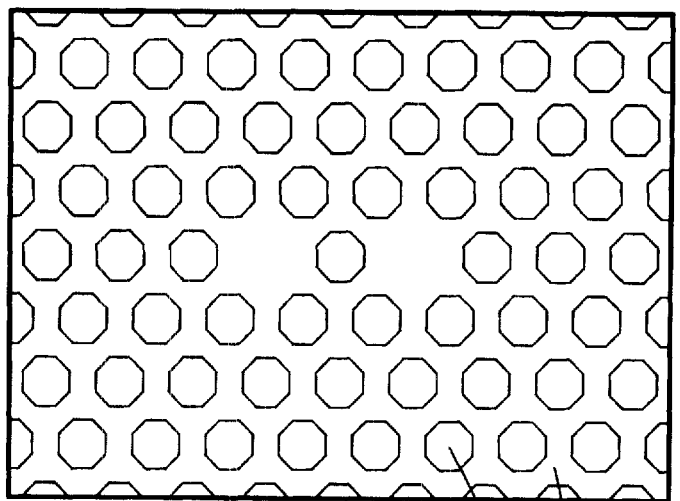
Figure 26B:
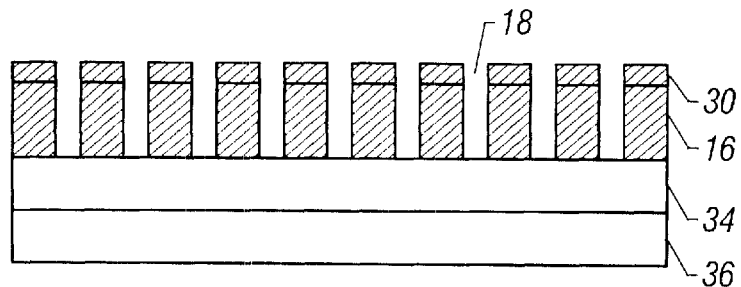
Figure 26C:
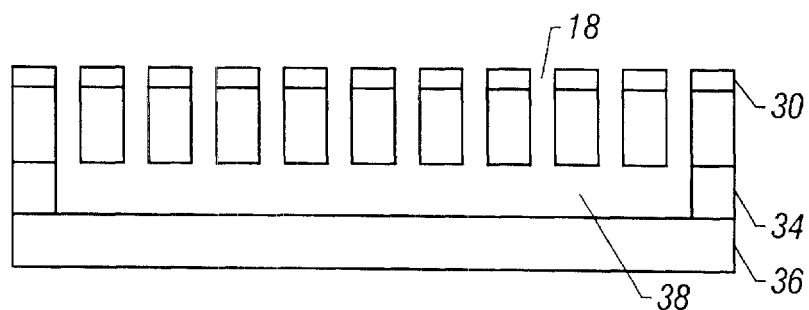

The exposed PMMA layer 30 is developed in a 3:7 solution of 2-ethoxyethanol:methanol for 30 seconds. The hole pattern is then transferred into the AlGaAs layer 16 of wafer 32 using the $Cl_2$ assisted ion beam etching as shown in FIG. 26b. After that, sacrificial AlAs layer 34 is dissolved in hydrofluoric acid (HF) diluted in water to define air cavity 38 shown in FIGS. 25a and 26c. HF attacks AlAs layer 34 very selectively over $Al_xGa_{1-x}As$ for x<0.4. Therefore, the percentage of Al in AlGaAs layer 16 is around 30%. Finally, the remaining PMMA layer 30 may be dissolved in acetone as shown in FIG. 25a. A perspective cross sectional view of the completed structure is shown in FIG. 25a and the SEM picture showing the top view of the fabricated cavity are shown in FIGS. 25b and 25c wherein FIG. 25b is an enlarged view of the SEM picture of FIG. 25c.

V. Conclusion

In conclusion, we have demonstrated that photonic crystal cavities 12 can be designed for strong interaction with atoms trapped in one of photonic crystal holes.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

For example, why it has implicitly assumed that holes 18 were air filled, it is also expressly to be understood that holes 18 may be filled with a material with a selected optical property to alter the index of refraction or other optical properties of the microcavity. In particular, holes 18 may be filled with optically nonlinear organic materials which are chosen to optimize or assist in tuning the microcavity, such as electro-optical polymers.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. An optical apparatus comprising:
    an array of holes in a photonic crystal; and
    a defect in said array of holes created by elongation of said holes in said array in a predetermined direction thereby defining in said array of holes in said photonic crystal an asymmetrical optical cavity with a Q factor in excess of 2000.

2. The apparatus of claim 1 wherein said array of holes in said photonic crystal is an hexagonal array.

3. The apparatus of claim 1 wherein said optical cavity is included in a laser.

4. The apparatus of claim 1 wherein said optical cavity is included in an optical waveguide.

5. The apparatus of claim 1 wherein said holes are filled with an optically nonlinear organic material.

6. The apparatus of claim 1 wherein said optical cavity has a Q in excess of 30,000.

7. The apparatus of claim 1 where said asymmetrical optical cavity, which is created by elongation of said holes in said array in a predetermined direction, is tuned.

8. The apparatus of claim 1 where said optical cavity is characterized by an electric field in said photonic crystal and in an air region, and where said optical cavity is arranged and configured to support modes having maximum electric (E) field intensity in said air region.

9. The apparatus of claim 1 where said optical cavity is characterized by a critical atom number, $N_0$, and a photon number, $m_0$, less than 1.

10. The apparatus of claim 1 where array of holes has a central hole with a radius reduced relative to other ones of said holes in said array, and where a row of holes including said central hole have their radii elongated in a defined direction.

11. The apparatus of claim 1 where neighboring ones of said holes are characterized by a distance between their respective centers and where said array of holes has a central hole with a radius reduced to $r_2$ relative to other ones of said holes in said array, and where selected neighboring holes to said central hole have their radii reduced to $r_1$ relative to other ones of said holes in said regular array and moved by $r-r_1$ away from said central hole in a direction defined by a line connecting centers of said central hole and said neighboring holes to preserve said distance between said neighboring holes and holes neighboring them in turn along said direction, and where a row of holes including said central hole have their radii elongated in a defined direction.

12. The apparatus of claim 11 where reduction of radius $r_2$ and $r_1$, movement by $r-r_1$ and elongation in said defined direction are tuned.

13. The apparatus of claim 1 where said defect is arranged and configured in said array to maximize microcavity mode quality factor Q and to minimize mode volume, $V_{mode}$.

14. The apparatus of claim 1 where said defect is arranged and configured in said array to strongly couple cavity field with a single gas phase atom.

15. The apparatus of claim 14 where spaces in said holes are defined as hole regions and where said defect is arranged and configured in said array to provide a maximum of E-field intensity in a hole region.

16. The apparatus of claim 14 where said defect is arranged and configured in said array to provide a maximum of E-field intensity in a region within said photonic crystal.

17. A method comprising the steps of:
defining an array of holes in a photonic crystal in which a defect in said array of holes created by elongation of said holes in said array in a predetermined direction thereby defining in said array of holes in said photonic crystal an asymmetrical optical cavity with a Q factor in excess of 2000; and
disposing said photonic crystal above a substrate separated therefrom by an air gap.

18. The method of claim 17 further comprises incorporating said optical cavity is included in a laser.

19. The method of claim 17 further comprises incorporating said optical cavity is included in an optical waveguide.

20. The method of claim 17 further comprising filling said holes are filled with an optically nonlinear organic material.

21. The method of claim 17 wherein said step of defining an array of holes in a photonic crystal creates an optical cavity has a Q in excess of 30,000.

22. The method of claim 17 where said step of defining an array of holes in a photonic crystal comprises tuning said optical cavity by means of controlling the degree of elongation in said predetermined direction.

23. The method of claim 17 where said step of defining an array of holes in a photonic crystal comprises controlling said elongation so that modes having maximum electric (E) field intensity in an nonsemiconductive region of said photonic crystal.

24. The method of claim 17 where said step of defining an array of holes in a photonic crystal comprises controlling said elongation so that said optical cavity is characterized by a critical atom number, $N_0$, and a photon number, $m_0$, less than 1.

25. The method of claim 17 where said step of defining an array of holes in a photonic crystal comprises controlling said elongation so that said array of holes has a central hole with a radius reduced relative to other ones of said holes in said array, and where a row of holes including said central hole have their radii elongated in a defined direction.

26. The method of claim 17 where said step of defining an array of holes in a photonic crystal comprises controlling said elongation so that neighboring ones of said holes are characterized by a distance between their respective centers and where said array of holes has a central hole with a radius reduced to $r_2$ relative to other ones of said holes in said array, and where selected neighboring holes to said central hole have their radii reduced to $r_1$ relative to other ones of said holes in said regular array and moved by $r-r_1$ away from said central hole in a direction defined by a line connecting centers of said central hole and said neighboring holes to preserve said distance between said neighboring holes and holes neighboring them in turn along said direction, and where a row of holes including said central hole have their radii elongated in a defined direction.

27. The method of claim 26 where said step of defining an array of holes in a photonic crystal comprises controlling said elongation so that reduction of radius $r_2$ and $r_1$, movement by $r-r_1$ and elongation in said defined direction are related to each other to tune said optical cavity.

28. The method of claim 17 where said step of defining an array of holes in a photonic crystal comprises controlling said elongation so that microcavity mode quality factor Q is maximized and mode volume, $V_{mode}$, is minimized.

29. The method of claim 17 where said step of defining an array of holes in a photonic crystal comprises controlling said elongation so that the cavity field is strongly coupled with a single gas phase atom.

30. The method of claim 29 where spaces in said holes are defined as hole regions and where said step of defining an array of holes in a photonic crystal comprises controlling said elongation so that a maximum of E-field intensity is provided in a hole region.

31. The method of claim 29 where said step of defining an array of holes in a photonic crystal comprises controlling said elongation so that a maximum of E-field intensity is provided in a region within said photonic crystal.

* * * * *

UNITED STATES PATENT AND TRADEMARK OFFICE
CERTIFICATE OF CORRECTION

PATENT NO. : 6,466,709 B1
APPLICATION NO. : 09/847743
DATED : October 15, 2002
INVENTOR(S) : Scherer et al.

It is certified that error appears in the above-identified patent and that said Letters Patent is hereby corrected as shown below:

At column 1, line 7, delete "DAAH04-96-1-0389" and insert "DAAD19-00-1-0374".

Signed and Sealed this

Fifteenth Day of August, 2006

JON W. DUDAS
*Director of the United States Patent and Trademark Office*